(12) United States Patent
Shim et al.

(10) Patent No.: US 9,418,913 B2
(45) Date of Patent: Aug. 16, 2016

(54) SEMICONDUCTOR DEVICE AND METHOD OF FORMING INSULATING LAYER ON CONDUCTIVE TRACES FOR ELECTRICAL ISOLATION IN FINE PITCH BONDING

(71) Applicant: STATS ChipPAC, Ltd., Singapore (SG)

(72) Inventors: Seong Bo Shim, Kyoung-gi-Do (KR); Kyung Oe Kim, Kyoung-gi-Do (KR); Yong Hee Kang, Kyoung-gi-Do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 13/682,510

(22) Filed: Nov. 20, 2012

(65) Prior Publication Data

US 2013/0075900 A1   Mar. 28, 2013

Related U.S. Application Data

(63) Continuation of application No. 12/961,202, filed on Dec. 6, 2010, now Pat. No. 8,349,721, which is a continuation-in-part of application No. 12/051,349, filed on Mar. 19, 2008, now Pat. No. 7,851,345.

(51) Int. Cl.
*H01L 23/488* (2006.01)
*H01L 23/00* (2006.01)
(Continued)

(52) U.S. Cl.
CPC ............ *H01L 23/48* (2013.01); *H01L 21/4846* (2013.01); *H01L 21/50* (2013.01);
(Continued)

(58) Field of Classification Search
CPC .............. H01L 23/4824; H01L 23/488; H01L 24/04–24/06
See application file for complete search history.

(56) References Cited

U.S. PATENT DOCUMENTS 4,122,479 A * 10/1978 Sugawara et al. ................ 257/82
4,818,728 A *  4/1989 Rai et al. ........................ 438/108
(Continued)

FOREIGN PATENT DOCUMENTS

JP   04-355933    9/1992
JP   10-256307    9/1998
(Continued)

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

*Primary Examiner* — David Zarneke
(74) *Attorney, Agent, or Firm* — Robert D. Atkins; Patent Law Group: Atkins and Associates, P.C.

(57) ABSTRACT

A semiconductor device has a semiconductor die with a plurality of bumps formed over an active surface of the semiconductor die. A plurality of first conductive traces with interconnect sites is formed over a substrate. The bumps are wider than the interconnect sites. A surface treatment is formed over the first conductive traces. A plurality of second conductive traces is formed adjacent to the first conductive traces. An oxide layer is formed over the second conductive traces. A masking layer is formed over an area of the substrate away from the interconnect sites. The bumps are bonded to the interconnect sites so that the bumps cover a top surface and side surface of the interconnect sites. The oxide layer maintains electrical isolation between the bump and second conductive trace. An encapsulant is deposited around bumps between the semiconductor die and substrate.

27 Claims, 25 Drawing Sheets

(51) Int. Cl.
*H01L 23/48* (2006.01)
*H01L 21/48* (2006.01)
*H01L 21/56* (2006.01)
*H01L 23/31* (2006.01)
*H01L 23/498* (2006.01)
*H05K 3/34* (2006.01)
*H01L 21/50* (2006.01)
*H01L 23/482* (2006.01)
*H01L 25/10* (2006.01)

(52) U.S. Cl.
CPC ......... *H01L 21/563* (2013.01); *H01L 23/3128* (2013.01); *H01L 23/49811* (2013.01); *H01L 23/49838* (2013.01); *H01L 23/49894* (2013.01); *H01L 24/13* (2013.01); *H01L 24/16* (2013.01); *H05K 3/3452* (2013.01); *H01L 23/4824* (2013.01); *H01L 24/04* (2013.01); *H01L 24/05* (2013.01); *H01L 24/06* (2013.01); *H01L 24/11* (2013.01); *H01L 24/48* (2013.01); *H01L 24/81* (2013.01); *H01L 25/105* (2013.01); *H01L 2224/0401* (2013.01); *H01L 2224/0558* (2013.01); *H01L 2224/05557* (2013.01); *H01L 2224/05568* (2013.01); *H01L 2224/05624* (2013.01); *H01L 2224/05639* (2013.01); *H01L 2224/05644* (2013.01); *H01L 2224/1134* (2013.01); *H01L 2224/131* (2013.01); *H01L 2224/1308* (2013.01); *H01L 2224/13016* (2013.01); *H01L 2224/13019* (2013.01); *H01L 2224/13082* (2013.01); *H01L 2224/13099* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/16225* (2013.01); *H01L 2224/16227* (2013.01); *H01L 2224/16235* (2013.01); *H01L 2224/16238* (2013.01); *H01L 2224/274* (2013.01); *H01L 2224/27013* (2013.01); *H01L 2224/32145* (2013.01); *H01L 2224/32225* (2013.01); *H01L 2224/48091* (2013.01); *H01L 2224/48247* (2013.01); *H01L 2224/73203* (2013.01); *H01L 2224/73204* (2013.01); *H01L 2224/73265* (2013.01); *H01L 2224/8114* (2013.01); *H01L 2224/8121* (2013.01); *H01L 2224/81385* (2013.01); *H01L 2224/81815* (2013.01); *H01L 2924/0002* (2013.01); *H01L 2924/00013* (2013.01); *H01L 2924/00014* (2013.01); *H01L 2924/014* (2013.01); *H01L 2924/01006* (2013.01); *H01L 2924/01013* (2013.01); *H01L 2924/01015* (2013.01); *H01L 2924/01027* (2013.01); *H01L 2924/01029* (2013.01); *H01L 2924/01033* (2013.01); *H01L 2924/01047* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/15151* (2013.01); *H01L 2924/15153* (2013.01); *H01L 2924/181* (2013.01); *H01L 2924/19041* (2013.01); *H05K 2201/10674* (2013.01); *H05K 2201/2081* (2013.01); *H05K 2203/0315* (2013.01)

(56) References Cited

U.S. PATENT DOCUMENTS

| | | |
|---|---|---|
| 5,378,859 A | 1/1995 | Shirasaki et al. |
| 5,386,624 A | 2/1995 | George et al. |
| 5,434,410 A | 7/1995 | Kulwicki |
| 5,508,561 A | 4/1996 | Tago et al. |
| 5,519,580 A | 5/1996 | Natarajan et al. |
| 5,650,595 A | 7/1997 | Bentlage et al. |
| 5,710,071 A | 1/1998 | Beddingfield et al. |
| 5,844,782 A | 12/1998 | Fukasawa |
| 5,869,886 A | 2/1999 | Tokuno |
| 5,872,399 A | 2/1999 | Lee |
| 5,889,326 A | 3/1999 | Tanaka |
| 5,915,169 A | 6/1999 | Heo |
| 5,985,456 A | 11/1999 | Zhou et al. |
| 6,201,305 B1 | 3/2001 | Darveaux et al. |
| 6,218,630 B1 | 4/2001 | Takigami |
| 6,228,466 B1 | 5/2001 | Tsukada et al. |
| 6,259,163 B1 | 7/2001 | Ohuchi et al. |
| 6,281,450 B1 | 8/2001 | Urasaki et al. |
| 6,297,560 B1 | 10/2001 | Capote et al. |
| 6,324,754 B1 | 12/2001 | DiStefano et al. |
| 6,329,605 B1 | 12/2001 | Beroz et al. |
| 6,335,568 B1 | 1/2002 | Yuzawa et al. |
| 6,335,571 B1 | 1/2002 | Capote et al. |
| 6,396,707 B1 | 5/2002 | Huang et al. |
| 6,431,432 B1 | 8/2002 | McCormick et al. |
| 6,441,316 B1 | 8/2002 | Kusui |
| 6,448,665 B1 | 9/2002 | Nakazawa et al. |
| 6,465,886 B1 * | 10/2002 | Horiuchi et al. ............. 257/738 |
| 6,518,163 B2 * | 2/2003 | Sakuyama et al. ............. 438/613 |
| 6,573,598 B2 * | 6/2003 | Ohuchi et al. ................. 257/734 |
| 6,573,610 B1 | 6/2003 | Tsai |
| 6,600,234 B2 | 7/2003 | Kuwabara et al. |
| 6,608,388 B2 | 8/2003 | Lin et al. |
| 6,614,113 B2 * | 9/2003 | Watanabe et al. ............. 257/750 |
| 6,622,380 B1 | 9/2003 | Grigg |
| 6,710,458 B2 | 3/2004 | Seko |
| 6,734,557 B2 | 5/2004 | Taniguchi et al. |
| 6,774,497 B1 | 8/2004 | Qi et al. |
| 6,780,673 B2 | 8/2004 | Venkateswaran |
| 6,787,918 B1 | 9/2004 | Tsai et al. |
| 6,809,262 B1 | 10/2004 | Hsu |
| 6,818,545 B2 | 11/2004 | Lee et al. |
| 6,849,944 B2 | 2/2005 | Murtuza et al. |
| 6,870,276 B1 | 3/2005 | Moxham et al. |
| 6,888,255 B2 | 5/2005 | Murtuza et al. |
| 6,913,948 B2 | 7/2005 | Caletka et al. |
| 7,005,585 B2 | 2/2006 | Ishizaki |
| 7,005,750 B2 | 2/2006 | Liu |
| 7,049,705 B2 | 5/2006 | Huang |
| 7,057,284 B2 | 6/2006 | Chauhan et al. |
| 7,064,435 B2 | 6/2006 | Chung et al. |
| 7,098,407 B2 | 8/2006 | Kim et al. |
| 7,102,239 B2 | 9/2006 | Pu et al. |
| 7,173,828 B2 | 2/2007 | Lin et al. |
| 7,224,073 B2 | 5/2007 | Kim |
| 7,242,099 B2 | 7/2007 | Lin et al. |
| 7,271,484 B2 | 9/2007 | Reiss et al. |
| 7,294,929 B2 | 11/2007 | Miyazaki |
| 7,317,245 B1 | 1/2008 | Lee et al. |
| 7,405,484 B2 | 7/2008 | Usui et al. |
| 7,436,063 B2 | 10/2008 | Miyata et al. |
| 7,521,284 B2 | 4/2009 | Miranda et al. |
| 7,642,660 B2 | 1/2010 | Tay et al. |
| 7,670,939 B2 | 3/2010 | Topacio et al. |
| 7,671,454 B2 | 3/2010 | Seko |
| 7,732,913 B2 | 6/2010 | Hsieh et al. |
| 7,750,457 B2 | 7/2010 | Seko |
| 7,790,509 B2 | 9/2010 | Gerber |
| 7,791,211 B2 | 9/2010 | Chen et al. |
| 7,847,399 B2 | 12/2010 | Masumoto |
| 7,847,417 B2 | 12/2010 | Araki et al. |
| 7,851,928 B2 | 12/2010 | Gallegos et al. |
| 7,898,083 B2 | 3/2011 | Castro |
| 7,902,660 B1 | 3/2011 | Lee et al. |
| 7,902,678 B2 | 3/2011 | Ohuchi et al. |

(56) References Cited

U.S. PATENT DOCUMENTS

| | | | |
|---|---|---|---|
| 7,902,679 | B2 | 3/2011 | Lin et al. |
| 7,932,170 | B1 | 4/2011 | Huemoeller et al. |
| 7,947,602 | B2 | 5/2011 | Ito et al. |
| 2002/0011666 | A1 | 1/2002 | Tandy |
| 2004/0056341 | A1 | 3/2004 | Endo et al. |
| 2004/0099961 | A1 | 5/2004 | Chu et al. |
| 2004/0232562 | A1 | 11/2004 | Hortaleza et al. |
| 2005/0067686 | A1* | 3/2005 | Usui .............. H01L 21/6835 257/690 |
| 2005/0103516 | A1 | 5/2005 | Kaneyuki |
| 2005/0248037 | A1 | 11/2005 | Hung et al. |
| 2005/0258544 | A1* | 11/2005 | Kim ............... H01L 23/49816 257/773 |
| 2005/0277226 | A1 | 12/2005 | Degani et al. |
| 2006/0131758 | A1 | 6/2006 | Dao |
| 2007/0200234 | A1 | 8/2007 | Gerber et al. |
| 2008/0093749 | A1 | 4/2008 | Gerber et al. |
| 2008/0179740 | A1 | 7/2008 | Liao |
| 2008/0277802 | A1 | 11/2008 | Tsai et al. |
| 2009/0108445 | A1 | 4/2009 | Liang |
| 2009/0114436 | A1 | 5/2009 | Chen et al. |
| 2009/0152716 | A1 | 6/2009 | Sohara |
| 2009/0191329 | A1 | 7/2009 | Wang |
| 2009/0288866 | A1 | 11/2009 | Tsai et al. |
| 2009/0308647 | A1 | 12/2009 | Liao |
| 2010/0139965 | A1 | 6/2010 | Wang et al. |
| 2011/0049703 | A1 | 3/2011 | Hsu et al. |

FOREIGN PATENT DOCUMENTS

| | | |
|---|---|---|
| JP | 2000-031204 | 1/2000 |
| JP | 2004-221205 | 5/2004 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

\* cited by examiner

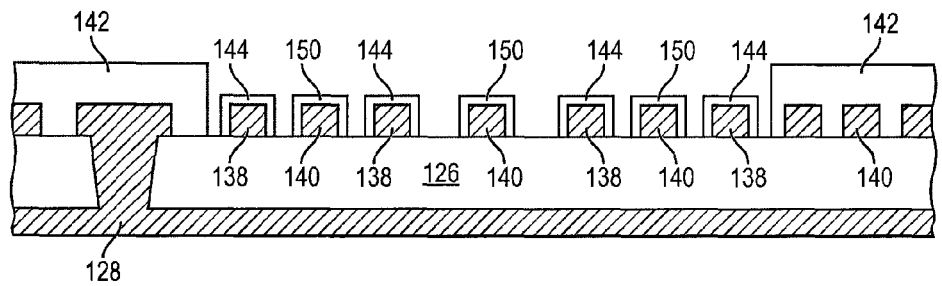
*FIG. 6d*
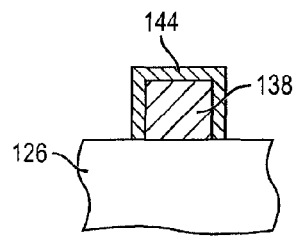 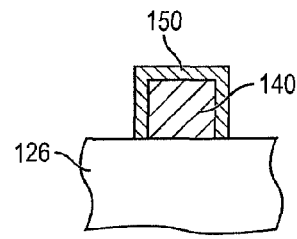
*FIG. 7a*        *FIG. 7b*
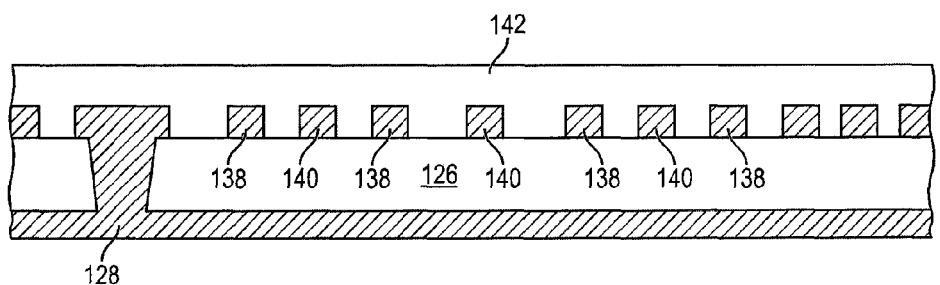
*FIG. 8a*

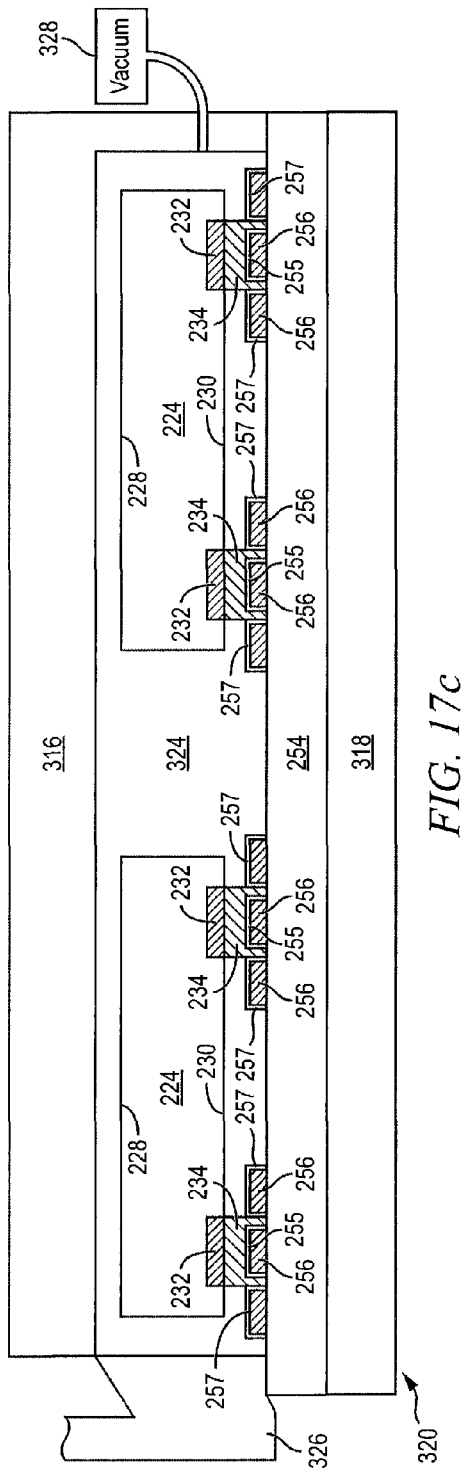
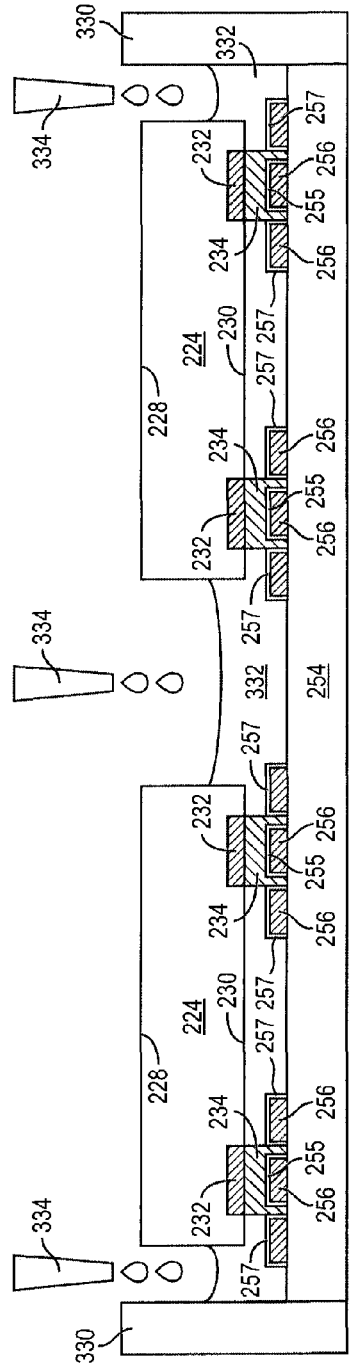
FIG. 17c
FIG. 18

SEMICONDUCTOR DEVICE AND METHOD OF FORMING INSULATING LAYER ON CONDUCTIVE TRACES FOR ELECTRICAL ISOLATION IN FINE PITCH BONDING

CLAIM TO DOMESTIC PRIORITY

The present application is a continuation of U.S. application Ser. No. 12/961,202, filed Dec. 6, 2010, now U.S. Pat. No. 8,349,721, which is a continuation-in-part of U.S. application Ser. No. 12/051,349, filed Mar. 19, 2008, now U.S. Pat. No. 7,851,345, which applications are incorporated herein by reference.

FIELD OF THE INVENTION

The present invention relates in general to semiconductor devices and, more particularly, to a semiconductor device having an insulating layer formed on the conductive signal traces for electrical isolation from bump material formed on adjacent interconnect sites in fine pitch bonding applications.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials Another goal of semiconductor manufacturing is to produce a package suitable for faster, reliable, smaller, and higher-density integrated circuits (IC) at lower cost. Flipchip packages or wafer level packages (WLP) are ideally suited for ICs demanding high speed, high density, and greater pin count. Flipchip style packaging involves mounting the active side of the die facedown toward a chip carrier substrate or printed circuit board (PCB). The electrical and mechanical interconnect between the active devices on the die and conduction tracks on the carrier substrate is achieved through a bump structure comprising a large number of conductive bumps or balls. The bumps are formed by a reflow process applied to solder material deposited on contact pads which are disposed on the semiconductor substrate. The bumps are then bonded to the carrier substrate. The flipchip semiconductor package provides a short electrical conduction path from the active devices on the die to the carrier substrate in order to reduce signal propagation, lower capacitance, and achieve overall better circuit performance.

FIGS. 1a-1b show a conventional flipchip configuration with a solder mask dam disposed between the bond pads. In FIG. 1a, a semiconductor die or flipchip 10 is shown for mounting to chip carrier substrate or printed circuit board (PCB) 14. The PCB contains a plurality of bonding pads 18. Flipchip 10 includes a plurality of bumps 12 disposed on an active surface of the die for interconnect to external devices. Flipchip 10 is mounted to PCB 14 in FIG. 1b. Bumps 12 are formed on bonding pads or under bump metallization layer (UBM) 15. An insulating layer 16 is formed on the active surface of flipchip 10 over UBM 15. A portion of insulating layer 16 is removed to attach bumps 12 to UBM 15. A solder mask dam 20 is formed on substrate 14. Bumps 12 are then metallurgically and electrically connected to bond pads 18 on substrate 14. The solder mask dam contains the solder reflow over the bond pads.

Many flipchip designs call for a fine pitch, e.g., less than 150 micrometers (μm), between the interconnect structures, such as the bump pads and signal traces on the PCB, for a higher interconnect density and input/output (I/O) terminal count. The solder mask dam requires more lateral space and therefore limits the bump and signal trace pitch. Without a solder mask dam, the solder could bridge or short to adjacent signal traces during the solder reflow process to join the flipchip to the PCB. For example, bumps 12 are shown in FIG. 2 as being metallurgically and electrically connected to the intended bond pads 18 using a solder reflow process. During solder reflow in a fine pitch design, the solder material may extend over the adjacent signal traces 22 due to misalignment or irregular bump diameter. In this case, bumps 18 would electrically bridge or short to signal traces 22 causing a defect.

While most flipchip PCBs are fabricated with solder on pad (SOP) printing to make robust solder joints on the bond pad, in case of fine pitch bonding, the SOP treatment of controlled collapsible chip connection (C4) is limited due to potential bridges between adjacent interconnect structures.

SUMMARY OF THE INVENTION

A need exists to form reliable and robust solder joints between the flipchip and printed circuit board in fine pitch applications. Accordingly, in one embodiment, the present invention is a method of making a semiconductor device comprising the steps of providing a substrate, forming a plurality of interconnect sites over the substrate, forming a plurality of conductive traces over the substrate adjacent to the interconnect sites, forming a plurality of insulating layers respectively over each of the conductive traces, and disposing a semiconductor die over the substrate with a plurality of interconnect structures electrically connecting the semiconductor die to the interconnect sites and contacting the insulating layers over the conductive traces.

In another embodiment, the present invention is a semiconductor device comprising a substrate and interconnect site formed over the substrate. A conductive trace is formed over the substrate less than 150 micrometers from the interconnect site. An insulating layer is formed over the conductive trace.

In another embodiment, the present invention is a method of making a semiconductor device comprising the steps of providing a substrate, forming an interconnect site over the substrate, forming a conductive trace over the substrate within a footprint of an interconnect structure to the interconnect site, and forming an insulating layer over the conductive trace.

In another embodiment, the present invention is a semiconductor device comprising a substrate and interconnect site formed over the substrate. A conductive trace is formed over the substrate within a footprint of an interconnect structure to the interconnect site. An insulating layer is formed over the conductive trace.

BRIEF DESCRIPTION OF THE DRAWINGS

FIGS. 6a-6d illustrate a process of forming a surface treatment on the contact pads and an oxide layer on the signal traces;

FIGS. 7a-7b illustrate the surface treatment formed on the contact pad and the oxide layer formed on the signal trace;

FIGS. 8a-8g illustrate an alternate process of forming the surface treatment on the contact pads and the oxide layer on the signal traces;

FIGS. 17a-17c illustrate mold underfill between the semiconductor die and substrate;

FIG. 18 illustrates another mold underfill between the semiconductor die and substrate;

DETAILED DESCRIPTION OF THE DRAWINGS

Figure 1A:
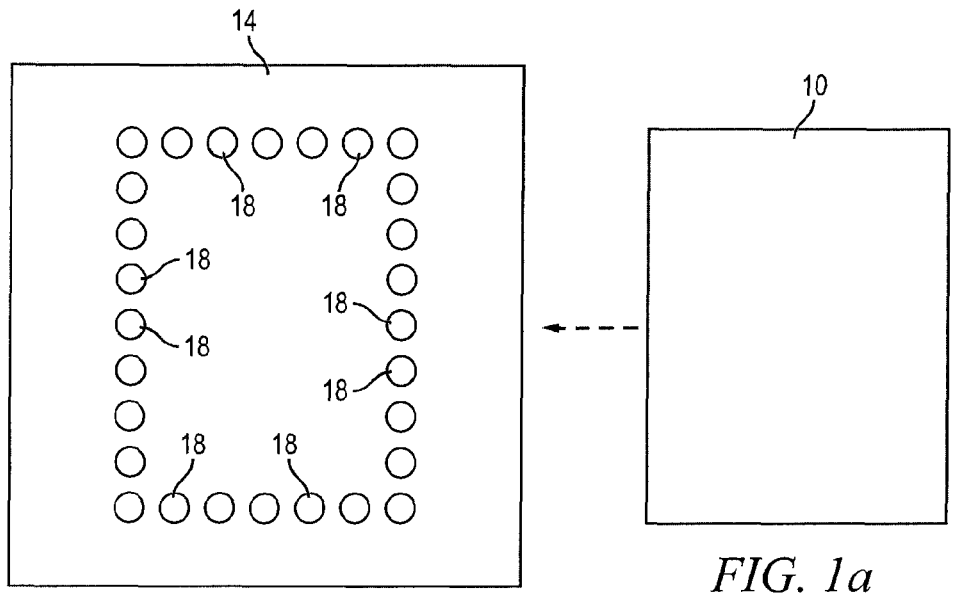
FIGS. 1a-1b illustrate a conventional flipchip with bumps connected to bonding pads on a PCB.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
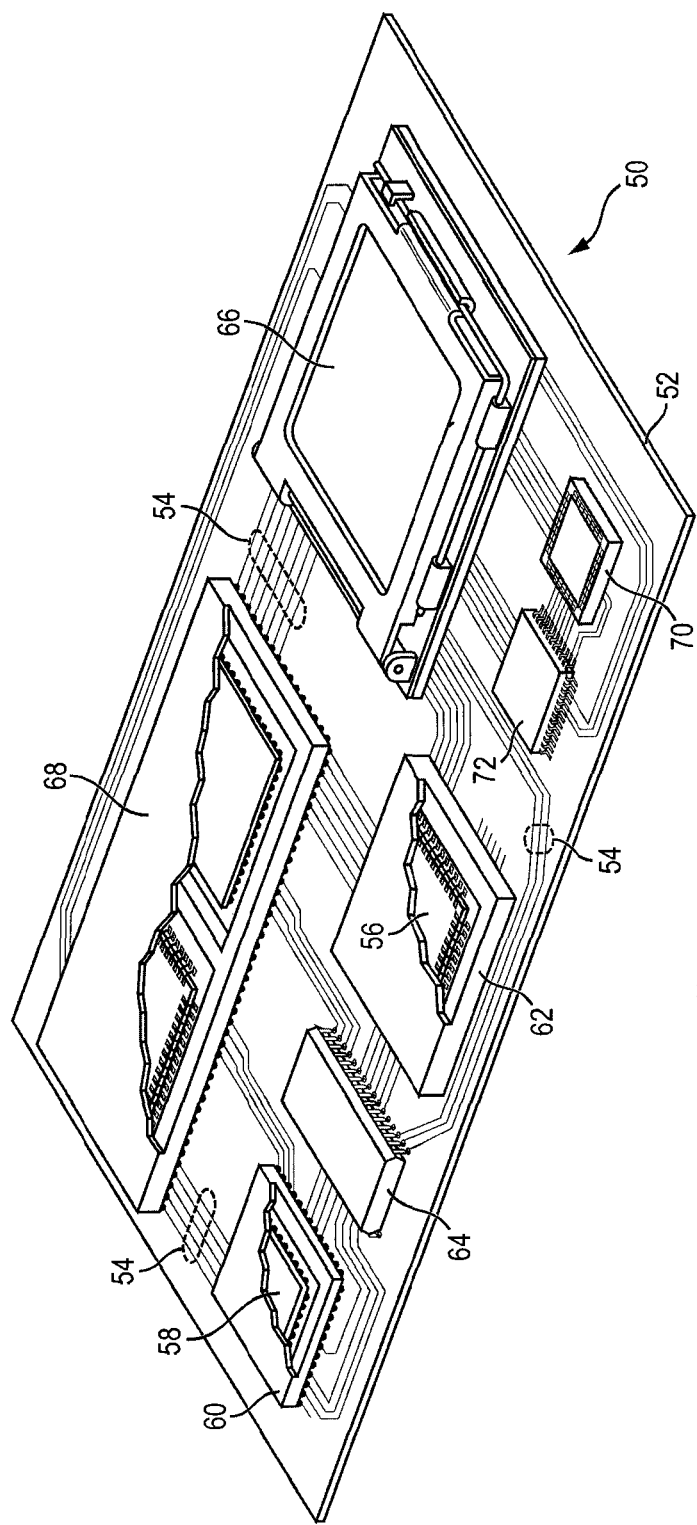
FIG. 3 illustrates a PCB with different types of packages mounted to its surface.

FIG. 3 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 3 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
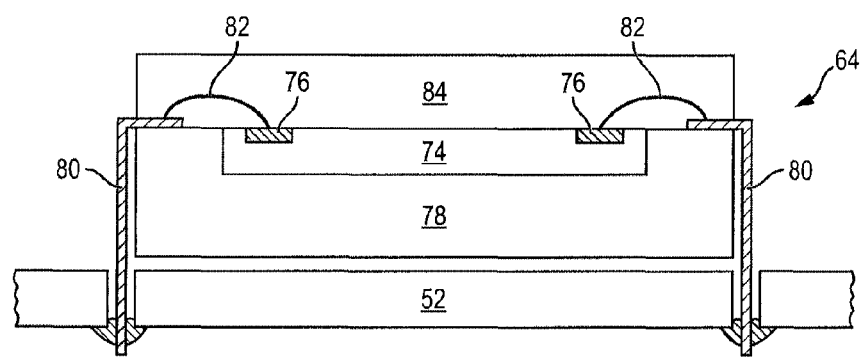
FIGS. 4a-4c illustrate further detail of the semiconductor packages mounted to the PCB.
Figure 4B:
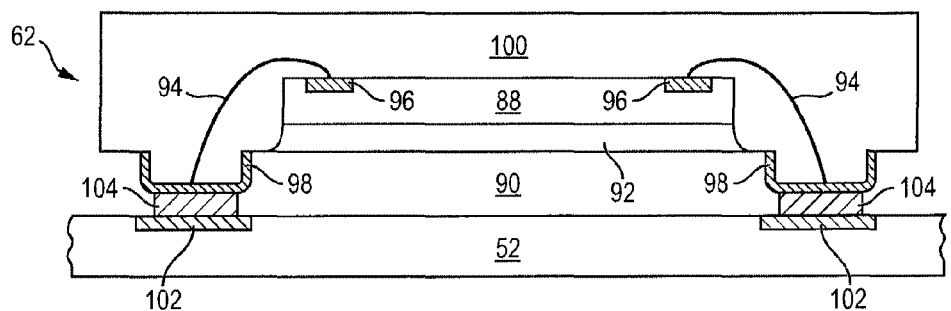
Figure 4C:
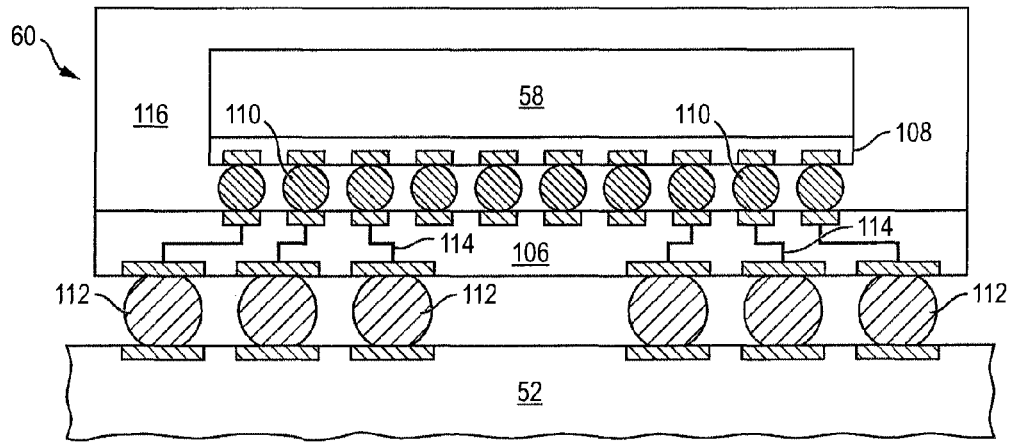

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 4b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 5A:
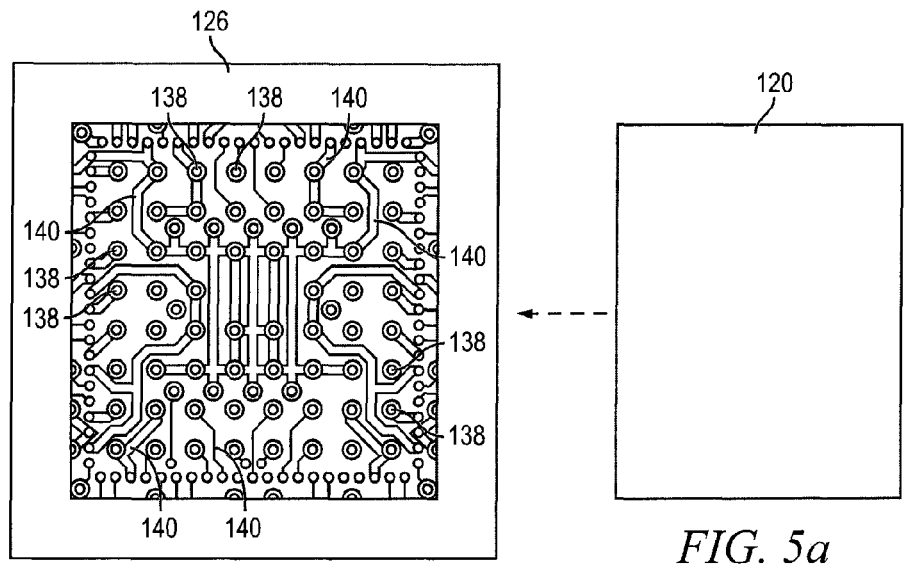
FIGS. 5a-5b illustrate a flipchip semiconductor device with bumps providing electrical interconnect between an active area of the die and chip carrier substrate.
Figure 5B:
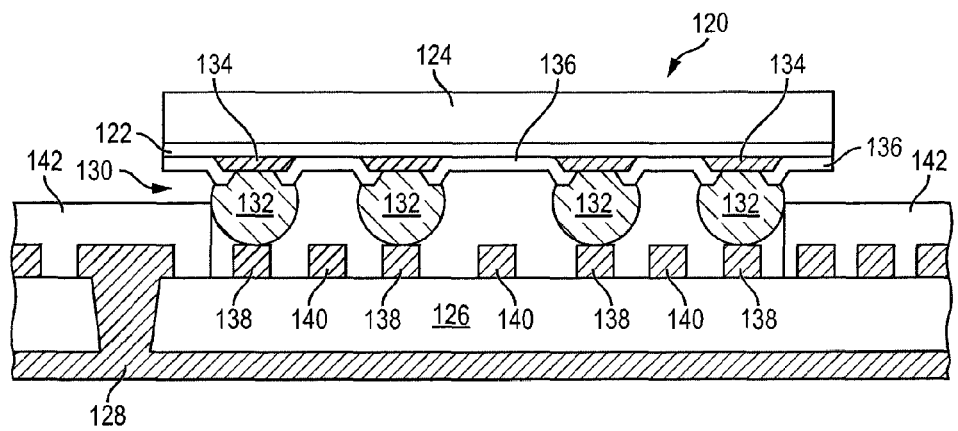

Flipchip semiconductor packages and wafer level packages (WLP) are commonly used with integrated circuits (ICs) demanding high speed, high density, and greater pin count. Flipchip style semiconductor device 120 involves mounting an active area 122 of semiconductor die 124 facedown toward a chip carrier substrate or printed circuit board (PCB) 126, as shown in FIGS. 5a and 5b. Region 128 is a copper plated area that shows blind via connected with inner metal layer. Active area 122 contains active and passive devices, conductive layers, and dielectric layers according to the electrical design of the die. The electrical and mechanical interconnect is achieved through a bump structure 130 comprising a large number of individual conductive bumps or balls 132. The bumps are formed on bump pads or interconnect sites 134, which are disposed on active area 122. The bump pads 134 are patterned and deposited as an electrically conductive layer over active area 122 using a physical vapor deposition (PVD), chemical vapor deposition (CVD), evaporation, sputtering, electrolytic plating, electroless plating, or other suitable deposition process. The bump pads 134 can be made with Al, Al alloy, Cu, Cu alloy, Sn, Ni, Au, Ag, or other electrically metal conductive material. The bump pads 134 can contain a UBM having a wetting layer, barrier layer, and adhesive layer. The bump pads 134 connect to the active and passive circuits by conduction tracks in active area 122. An insulating layer 136 is formed over active area 122 and bump pads 134. The insulating layer 136 can be made with silicon nitride (SixNy), silicon dioxide (SiO2), silicon oxynitride (SiON), tantalum pentoxide (Ta2O5), zircon (ZrO2), aluminum oxide (Al2O3), or other material having electrical insulation properties. The insulating layer 136 can be dispensed as liquid encapsulant followed by spin-coating or spray coating dielectric material with different viscosity. The insulating layer 136 can also be pressed or coated to cover the semiconductor die. A portion of insulating layer 136 is removed by an etching process to expose bump pads 134.

An electrically conductive bump material is deposited in the insulating layer opening over bump pads 134 using an evaporation, electrolytic plating, electroless plating, or ball drop process. The bump material can be any metal or electrically conductive material, e.g., Sn, lead (Pb), Ni, Au, Ag, Cu, bismuthinite (Bi), and alloys thereof. For example, the bump material can be eutectic Sn/Pb, high lead, lead free, or other solder materials. The bump material is reflowed by heating the material above its melting point to form bumps 132. In some applications, bumps 132 are reflowed a second time to improve electrical contact to bump pads 134.

The metal contact pad 138 and signal conductors or traces 140 are formed on PCB 126 within masking layer 142 by PVD, CVD, evaporation, sputtering, electrolytic plating, electroless plating, or other suitable metal deposition process. Contact pads 138 and signal traces 140 can be made with Cu, Al, Al/Cu alloys, or other electrically conductive metal. Signal traces 140 are formed adjacent to contact pads 138 with a fine pitch, e.g., less than 150 µm, to achieve a high density interconnect. The flipchip semiconductor device provides a short electrical conduction path from the active devices on semiconductor die 124 to conduction tracks on PCB 126 in order to reduce signal propagation, lower capacitance, and achieve overall better circuit performance.

Figure 6A:
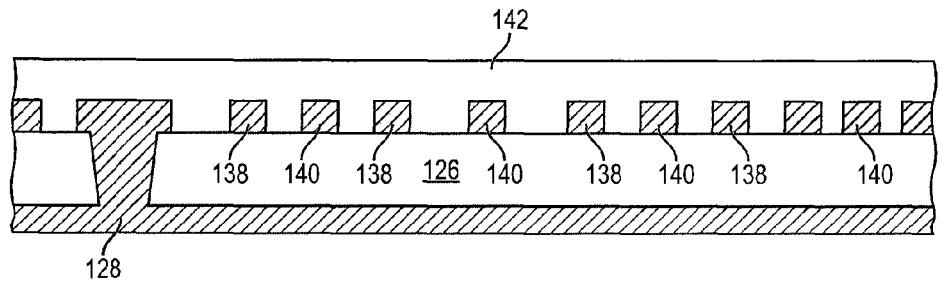
Figure 6B:
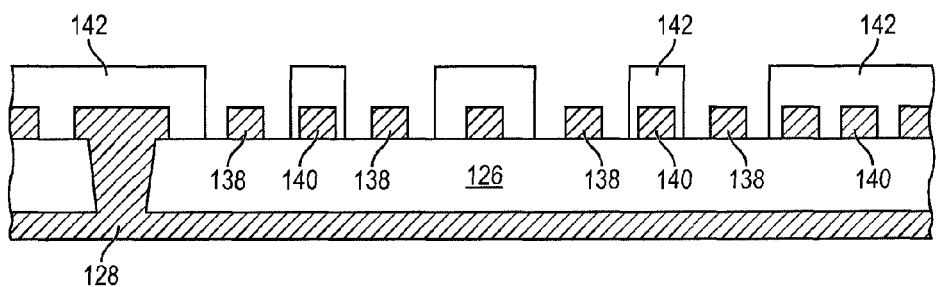

Further detail of forming the fine pitch, high density contact pads 138 and signal traces 140 is shown in FIGS. 6a-6d. FIG. 6a shows the multi-layer PCB 126 with a plurality of contact pads 138 and signal traces 140 formed on the PCB. A masking layer 142 is formed over contact pads 138 and signal traces 140. In FIG. 6b, mask layer 142 is patterned and exposed to ultraviolet (UV) light. The patterned area of mask layer 142 is developed to expose contact pads 138. An electroless surface treatment is applied to contact pads 138 by immersion in a solution of Sn, electroless nickel immersion gold (ENIG), or organic solderability preservative (OSP). FIG. 7a shows the electroless surface treatment 144 formed over contact pad 138.

Figure 1B:
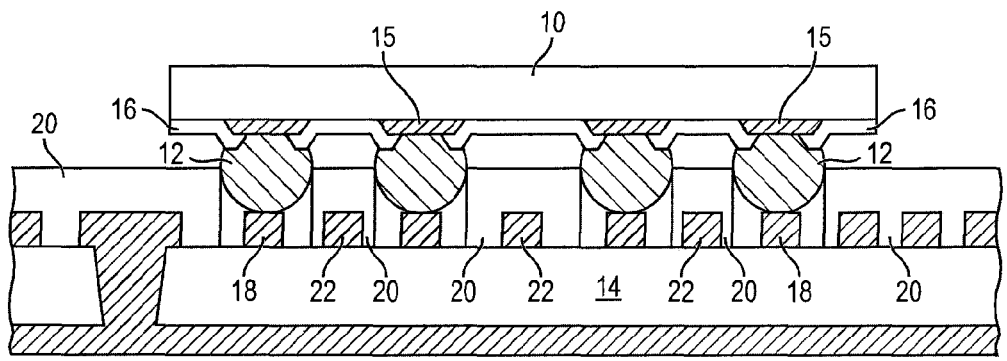
Figure 2:
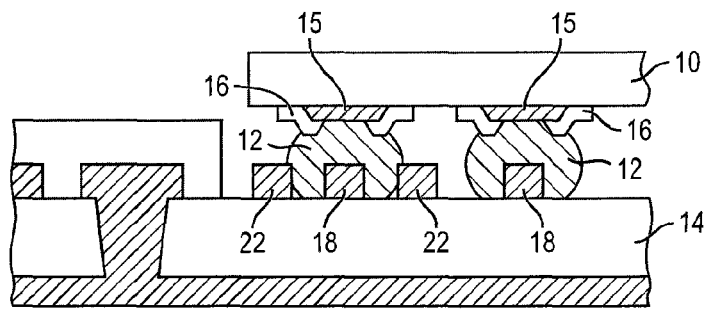
FIG. 2 illustrates the bumps bridging to signal traces formed adjacent to the bonding pads.
Figure 6C:
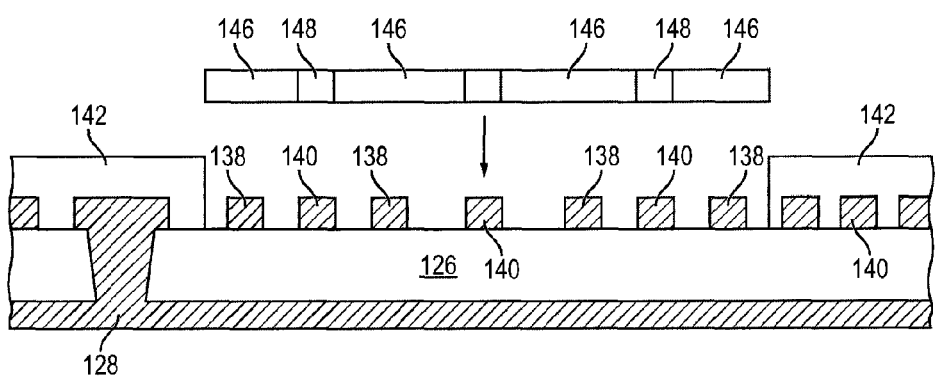

In FIG. 6c, the remaining portion of mask layer 142 is exposed and developed. Since mask layer 142 is removed, contact pads 138 and signal traces 140 in FIG. 5b are no longer constrained by the design rule used in the prior art implementation of FIG. 1b. A film layer 146 is formed over contact pads 138. The film layer 146 can be made with dry film and artwork film and then UV irradiation. Film layer 146 has openings 148 to expose signal traces 140. An oxidation treatment is applied to film layer 146 to selectively form an oxide layer through openings 148 onto signal traces 140. The oxide layer can be made with cupric oxide layer from an oxygen atmosphere. Film layer 146 and electroless surface treatment 144 prevents formation of an oxide layer on contact pads 138. FIG. 7b shows oxide layer 150 formed over contact pad 138. In FIG. 6d, the film layer 146 is removed leaving contact pads 138 covered by electroless surface treatment 144 and signal traces 140 coated with oxide layer 150.

Figure 8B:
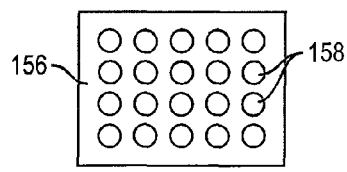
Figure 8C:
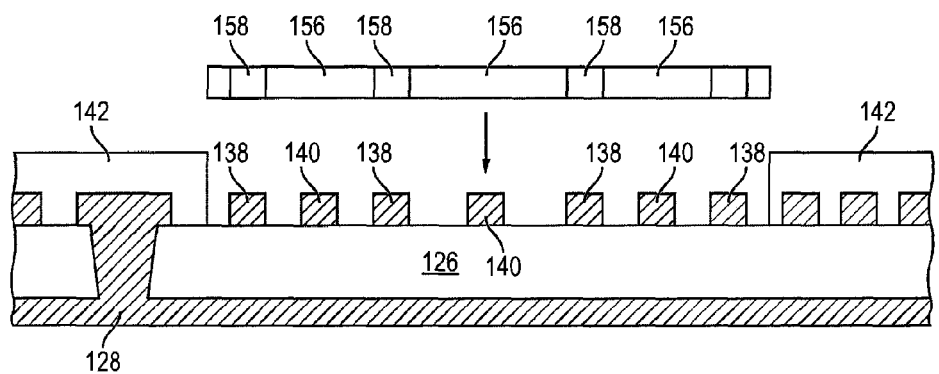
Figure 8D:
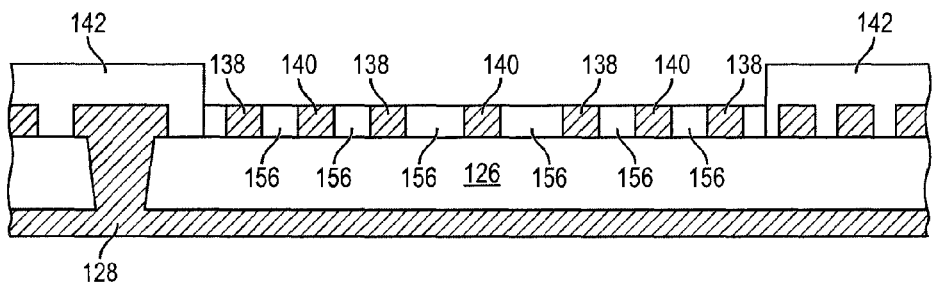
Figure 8E:
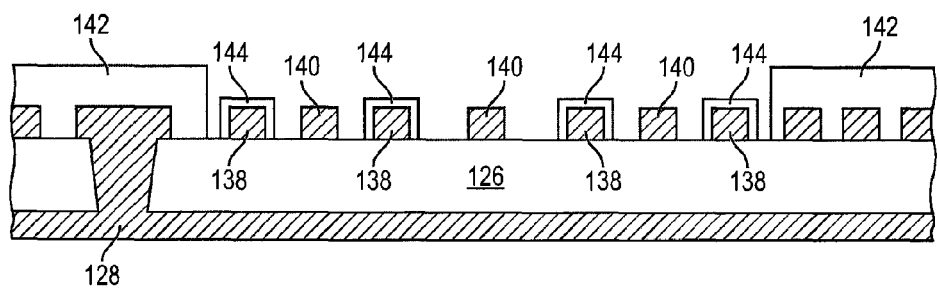

An alternate embodiment of forming the fine pitch, high-density contact pads 138 and signal traces 140 is shown in FIGS. 8a-8f. FIG. 8a shows the multi-layer PCB 126 with a plurality of contact pads 138 and signal traces 140 formed on the PCB. A masking layer 142 is formed over contact pads 138 and signal traces 140. The masking layer 142 is patterned, exposed to UV light, and developed to remove all portions of the masking layer over contact pads 138 and signal traces 140. FIG. 8b is a top view of film layer 156 with openings 158. In FIGS. 8c and 8d, film layer 156 is applied over signal traces 140. The openings 158 of film layer 156 expose contact pads 138. An electroless surface treatment is selectively applied to contact pads 138 by immersion in a solution of Sn, ENIG, or OSP. Film layer 156 prevents formation of the electroless surface treatment on signal traces 140. Film layer 156 is then removed. FIG. 8e shows electroless surface treatment 144 formed over contact pads 138.

Figure 8F:
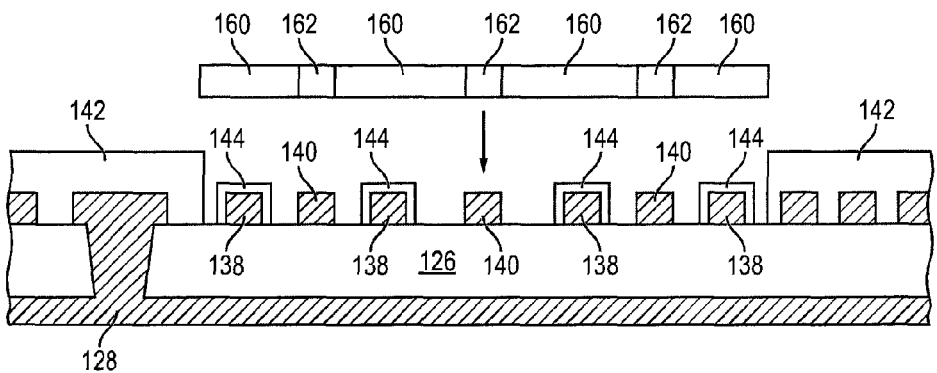
Figure 8G:
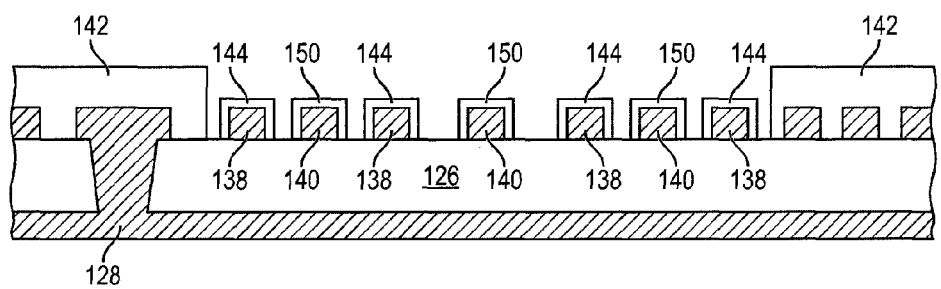

In FIG. 8f, a film layer 160 is applied over contact pads 138. Film layer 160 has openings 162 over signal traces 140. An oxidation treatment is applied to film layer 160 to selectively form an oxide layer through openings 162 onto signal traces 140. Film layer 160 and electroless surface treatment 144 prevents formation of the oxide layer on contact pads 138. Film layer 160 is then removed. FIG. 8g shows contact pads 138 covered by electroless surface treatment 144 and signal traces 140 coated with oxide layer 150.

Figure 9:
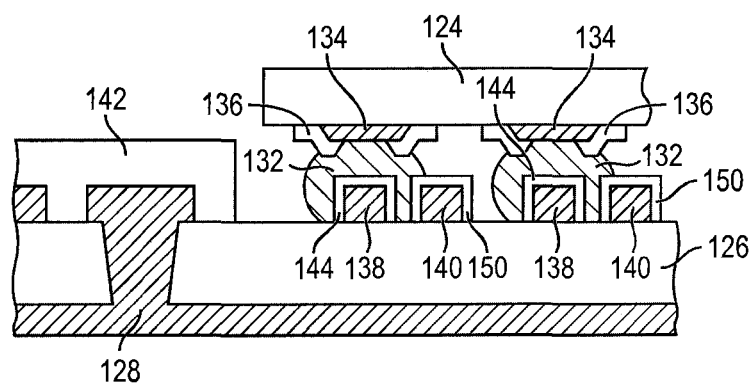
FIG. 9 illustrates a cross-sectional view of a flipchip semiconductor device with oxidized signal traces for electrical isolation from bumps formed on adjacent contact pads.

In FIG. 9, bumps 132 formed on bump pads 134 of semiconductor die 124 are metallurgically and electrically connected to contact pads 138 on PCB 126 using a reflow process. The electroless surface treatment 144 on contact pads 138 aids in the metallurgical connection. The spacing between contact pads 138 and signal traces 140 is a fine pitch, less than 150 µm. Accordingly, during the reflow process, the bump material may potentially extend over signal trace 140 due to misalignment or irregular bump diameter. In the event that bump 132 physically contacts oxide layer 150 over signal trace 140, the oxide coating over the signal trace maintains electrical isolation between the bump and signal trace. The oxidized signal trace does not melt with the contact pad during the reflow process. Under the fine pitch design rule, bumps 132 can extend outside the boundaries of contact pads 138, including the area over signal traces 50, without unintentionally electrically bridging or shorting the contact pad to the signal trace. Moreover, by completely removing the masking layer 142 from contact pads 138 and signal traces 140, these interconnect structures can be placed closer together, i.e., given a finer pitch, without causing defects as the design rule requiring additional lateral spacing for the masking layer between the contact pads is no longer necessary. The oxide layer 150 over signal trace 140 maintains electrical isolation of the signal trace with respect to bump 132 and contact pad 138.

Figure 10:
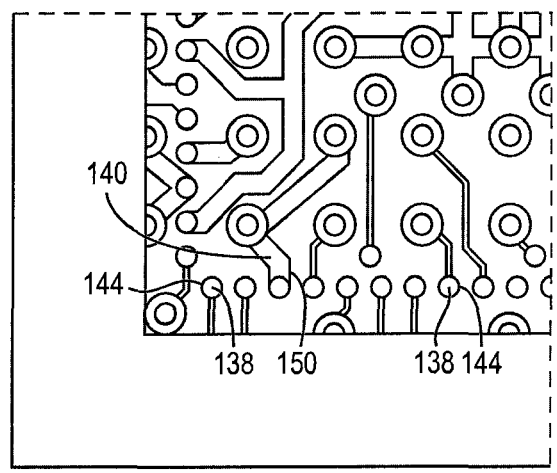
FIG. 10 illustrates a top view of a flipchip semiconductor device with oxidized signal traces for electrical isolation from bumps formed on adjacent contact pads.

FIG. 10 shows a top view of a corner of PCB 126. Contact pads 138 are coated with an electroless surface treatment 144. Signal traces 140 are coated with oxide layer 150. Due to the fine pitch, the bumps, which are metallurgically connected to contact pads 138, may extend over signal traces 140. However, no defect occurs because the contact pad remains electrically isolated from the signal trace due to the oxide layer formed over the signal trace. The oxidized signal trace does not melt with the contact pad during the reflow process.

The demand for higher interconnect density and reduced packaging cost require a fine pitch for high I/O count. By removing the final masking layer from the design, the semiconductor package can have a finer pitch between the interconnect structures and a higher I/O density. The signal traces are coated with an oxide layer to prevent bridging during the reflow process which metallurgically joins the bumps to the contact pads. In the event that the bump physically contacts the oxide layer over the signal trace, due to misalignment or irregular bump diameter, the oxidized signal trace does not melt with the contact pad during the reflow process. The contact pad and bump remain electrically isolated from the signal trace by virtue of the oxide layer formed over the signal trace.

FIGS. 11-16 describe other embodiments with various interconnect structures which can be used in combination with the electroless surface treatment and oxide layer over adjacent interconnect structures, as described in FIGS. 6a-6d, 7a-7b, 8a-8g, and 9. FIG. 11a shows a semiconductor wafer 220 with a base substrate material 222, such as silicon, germanium, gallium arsenide, indium phosphide, or silicon carbide, for structural support. A plurality of semiconductor die or components 224 is formed on wafer 220 separated by saw streets 226 as described above.

Figure 11A:
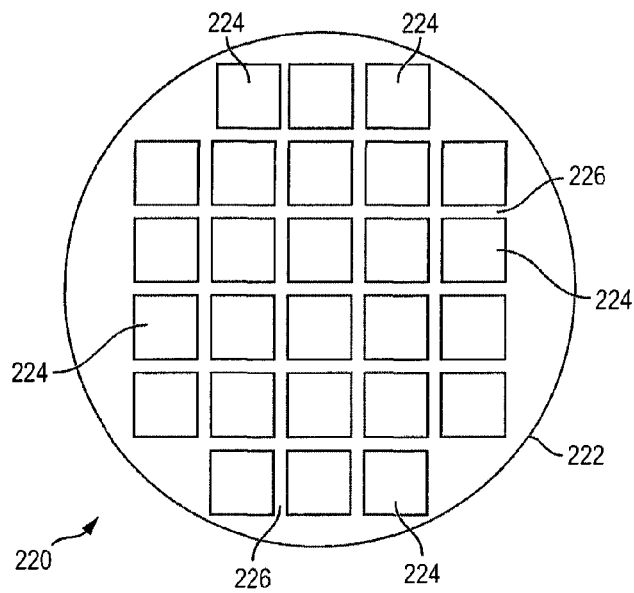
FIGS. 11a-11h illustrate various interconnect structures formed over a semiconductor die for bonding to conductive traces on a substrate.
Figure 11B:
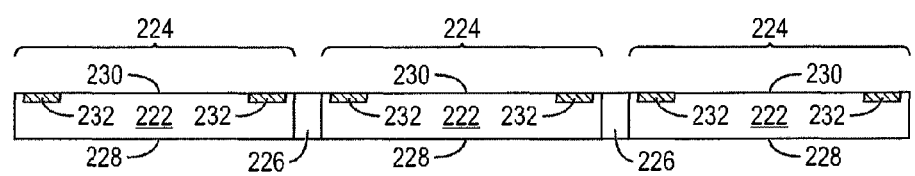

FIG. 11b shows a cross-sectional view of a portion of semiconductor wafer 220. Each semiconductor die 224 has a back surface 228 and active surface 230 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 230 to implement analog circuits or digital circuits, such as digital signal processor (DSP), ASIC, memory, or other signal processing circuit. Semiconductor die 224 can also contain integrated passive devices (IPDs), such as inductors, capacitors, and resistors, for RF signal processing. In one embodiment, semiconductor die 224 is a flipchip type semiconductor die.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads electrically connected to the circuits on active surface 230.

Figure 11C:
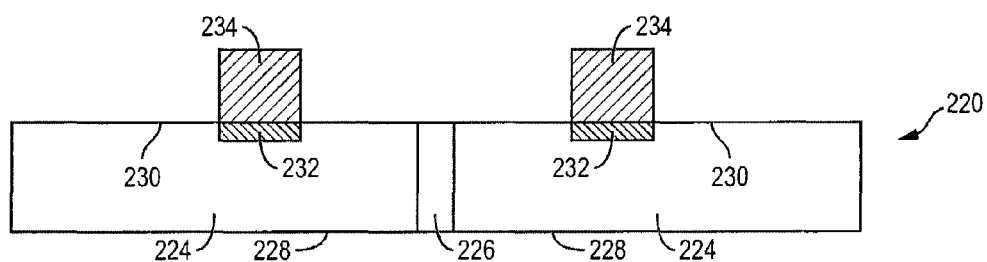
Figure 11D:
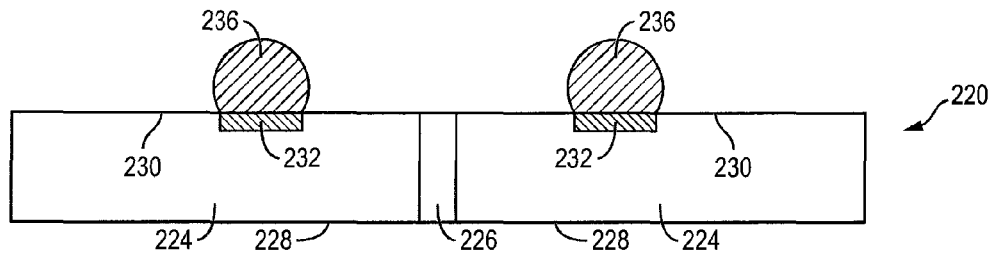

FIG. 11c shows a portion of semiconductor wafer 220 with an interconnect structure formed over contact pads 232. An electrically conductive bump material 234 is deposited over contact pads 232 using an evaporation, electrolytic plating, electroless plating, ball drop, or screen printing process. Bump material 234 can be Al, Sn, Ni, Au, Ag, Pb, Bi, Cu, solder, and combinations thereof, with an optional flux solution. For example, bump material 234 can be eutectic Sn/Pb, high-lead solder, or lead-free solder. Bump material 234 is generally compliant and undergoes plastic deformation greater than about 25 µm under a force equivalent to a vertical load of about 200 grams. Bump material 234 is bonded to contact pad 232 using a suitable attachment or bonding process. For example, bump material 234 can be compression bonded to contact pad 232. Bump material 234 can also be reflowed by heating the material above its melting point to form spherical balls or bumps 236, as shown in FIG. 11d. In some applications, bumps 236 are reflowed a second time to improve electrical connection to contact pad 232. Bumps 236 represent one type of interconnect structure that can be formed over contact pad 232. The interconnect structure can also use stud bump, micro bump, or other electrical interconnect.

Figure 11E:
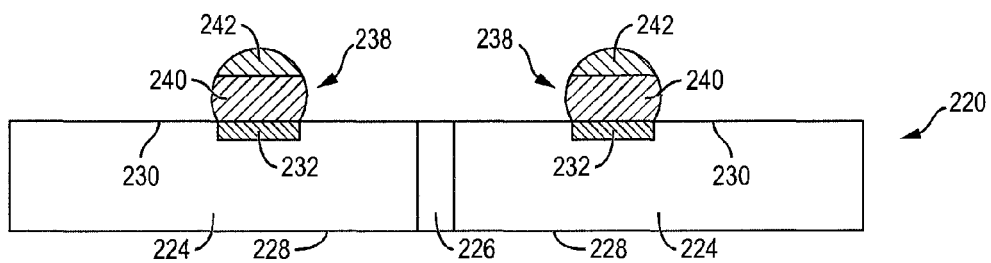

FIG. 11e shows another embodiment of the interconnect structure formed over contact pads 232 as composite bumps 238 including a non-fusible or non-collapsible portion 240 and fusible or collapsible portion 242. The fusible or collapsible and non-fusible or non-collapsible attributes are defined for bumps 238 with respect to reflow conditions. The non-fusible portion 240 can be Au, Cu, Ni, high-lead solder, or lead-tin alloy. The fusible portion 242 can be Sn, lead-free alloy, Sn—Ag alloy, Sn—Ag—Cu alloy, Sn—Ag—indium (In) alloy, eutectic solder, tin alloys with Ag, Cu, or Pb, or other relatively low temperature melt solder. In one embodiment, given a contact pad 232 width or diameter of 100 µm, the non-fusible portion 240 is about 45 µm in height and fusible portion 242 is about 35 µm in height.

Figure 11F:
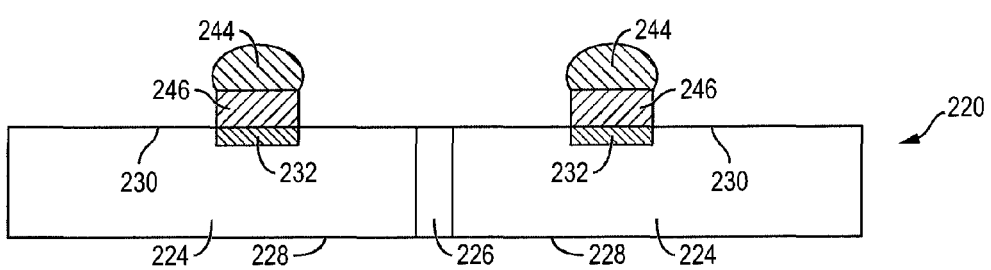

FIG. 11f shows another embodiment of the interconnect structure formed over contact pads 232 as bump 244 over conductive pillar 246. Bump 244 is fusible or collapsible and conductive pillar 246 is non-fusible or non-collapsible. The fusible or collapsible and non-fusible or non-collapsible attributes are defined with respect to reflow conditions. Bump 244 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. Conductive pillar 246 can be Au, Cu, Ni, high-lead solder, or lead-tin alloy. In one embodiment, conductive pillar 246 is a Cu pillar and bump 244 is a solder cap. Given a contact pad 232 width or diameter of 100 µm, conductive pillar 246 is about 45 µm in height and bump 244 is about 35 µm in height.

Figure 11G:
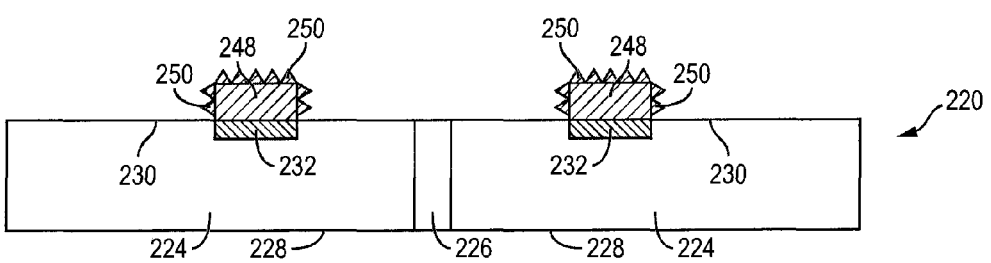

FIG. 11g shows another embodiment of the interconnect structure formed over contact pads 232 as bump material 248 with asperities 250. Bump material 248 is soft and deformable under reflow conditions with a low yield strength and high elongation to failure, similar to bump material 234. Asperities 250 are formed with a plated surface finish and are shown exaggerated in the figures for purposes of illustration. The scale of asperities 250 is generally in the order about 1-25 µm. The asperities can also be formed on bump 236, composite bump 238, and bump 244.

Figure 11H:
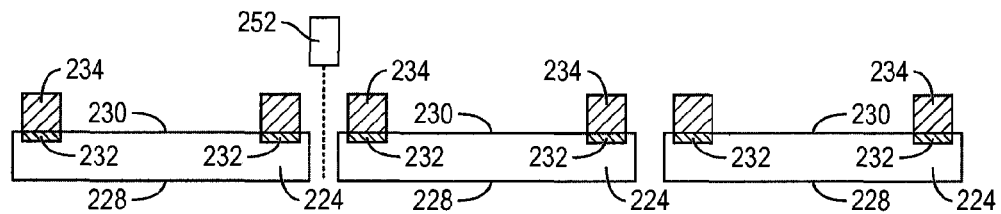

In FIG. 11h, semiconductor wafer 220 is singulated through saw street 226 using a saw blade or laser cutting tool 252 into individual semiconductor die 224.

Figure 12A:
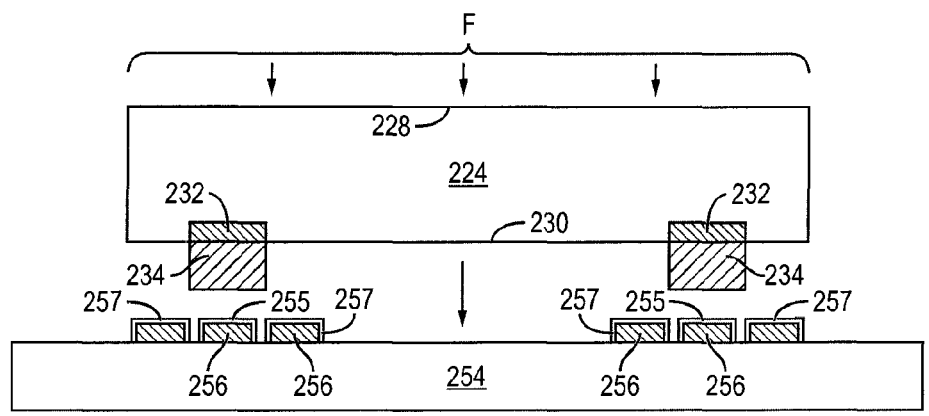
FIGS. 12a-12g illustrate the semiconductor die and interconnect structure bonded to the conductive traces.

FIG. 12a shows a substrate or PCB 254 with conductive trace 256. Substrate 254 can be a single-sided FR5 laminate or 2-sided BT-resin laminate. Semiconductor die 224 is positioned so that bump material 234 is aligned with an interconnect site on conductive trace 256, see FIGS. 20a-20g. Alternatively, bump material 234 can be aligned with a conductive pad or other interconnect site formed on substrate 254. Bump material 234 is wider than conductive trace 256. In one embodiment, bump material 234 has a width of less than 100 µm and conductive trace or pad 256 has a width of 35 µm for a bump pitch of 150 µm. Conductive traces 256 with interconnect sites are covered by electroless surface treatment 255 and adjacent conductive traces 256 are coated with oxide or insulating layer 257, as described in FIGS. 6a-6d and 8a-8g and similar to FIGS. 7a and 7b.

Figure 12B:
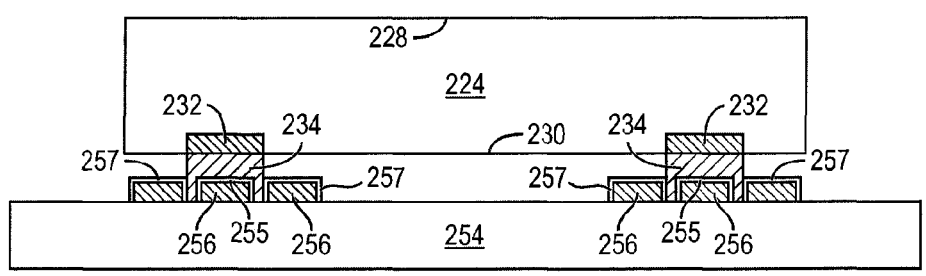

A pressure or force F is applied to back surface 228 of semiconductor die 224 to press bump material 234 onto conductive trace 256. The force F can be applied with an elevated temperature. Due to the compliant nature of bump material 234, the bump material deforms or extrudes around the top surface and side surface of conductive trace 256, referred to as bump-on-lead (BOL). In particular, the application of pressure causes bump material 234 to undergo a plastic deformation greater than about 25 µm under force F equivalent to a vertical load of about 200 grams and cover the top surface and side surface of the conductive trace, as shown in FIG. 12b. Bump material 234 can also be metallurgically connected to conductive trace 256 by bringing the bump material in physical contact with the conductive trace and then reflowing the bump material under a reflow temperature.

By making conductive trace 256 narrower than bump material 234, the conductive trace pitch can be reduced to increase routing density and I/O count. The narrower conductive trace 256 reduces the force F needed to deform bump material 234 around the conductive trace. For example, the requisite force F may be 30-50% of the force needed to deform bump material against a conductive trace or pad that is wider than the bump material. The lower compressive force F is useful for fine pitch interconnect and small die to maintain coplanarity with a specified tolerance and achieve uniform z-direction deformation and high reliability interconnect union. In addition, deforming bump material 234 around conductive trace 256 mechanically locks the bump to the trace to prevent die shifting or die floating during reflow. The oxide layer 257 prevents electrical shorting between adjacent conductive traces 256, as described in FIG. 9.

Figure 12C:
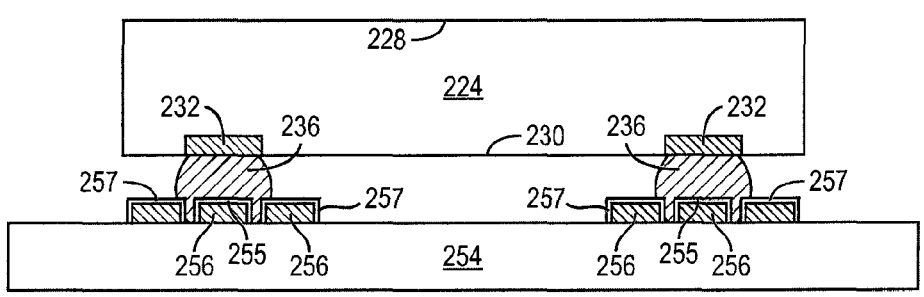

FIG. 12c shows bump 236 formed over contact pad 232 of semiconductor die 224. Semiconductor die 224 is positioned so that bump 236 is aligned with an interconnect site on conductive trace 256. Alternatively, bump 236 can be aligned with a conductive pad or other interconnect site formed on substrate 254. Bump 236 is wider than conductive trace 256. Conductive traces 256 with interconnect sites are covered by electroless surface treatment 255 and adjacent conductive traces 256 are coated with oxide or insulating layer 257, as described in FIGS. 6a-6d and 8a-8g and similar to FIGS. 7a and 7b.

A pressure or force F is applied to back surface 228 of semiconductor die 224 to press bump 236 onto conductive trace 256. The force F can be applied with an elevated temperature. Due to the compliant nature of bump 236, the bump deforms or extrudes around the top surface and side surface of conductive trace 256. In particular, the application of pressure causes bump material 236 to undergo a plastic deformation and cover the top surface and side surface of conductive trace 256. Bump 236 can also be metallurgically connected to conductive trace 256 by bringing the bump in physical contact with the conductive trace under reflow temperature.

By making conductive trace 256 narrower than bump 236, the conductive trace pitch can be reduced to increase routing density and I/O count. The narrower conductive trace 256 reduces the force F needed to deform bump 236 around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming bump 236 around conductive trace 256 mechanically locks the bump to the trace to prevent die shifting or die floating during reflow. The oxide layer 257 prevents electrical shorting between adjacent conductive traces 256, as described in FIG. 9.

Figure 12D:
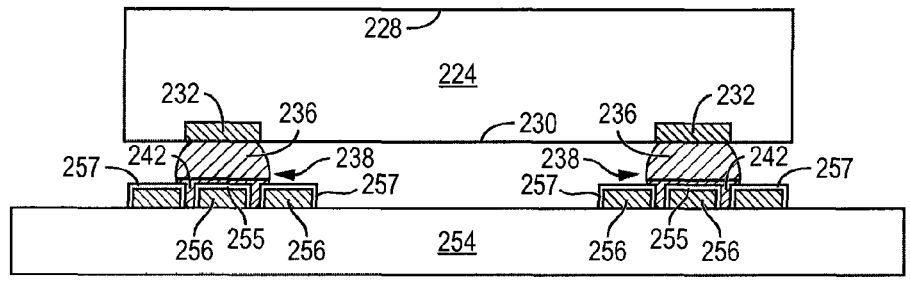

FIG. 12d shows composite bump 238 formed over contact pad 232 of semiconductor die 224. Semiconductor die 224 is positioned so that composite bump 238 is aligned with an interconnect site on conductive trace 256. Alternatively, composite bump 238 can be aligned with a conductive pad or other interconnect site formed on substrate 254. Composite bump 238 is wider than conductive trace 256. Conductive traces 256 with interconnect sites are covered by electroless surface treatment 255 and adjacent conductive traces 256 are coated with oxide or insulating layer 257, as described in FIGS. 6a-6d and 8a-8g and similar to FIGS. 7a and 7b.

A pressure or force F is applied to back surface 228 of semiconductor die 224 to press fusible portion 242 onto conductive trace 256. The force F can be applied with an elevated temperature. Due to the compliant nature of fusible portion 242, the fusible portion deforms or extrudes around the top surface and side surface of conductive trace 256. In particular, the application of pressure causes fusible portion 242 to undergo a plastic deformation and cover the top surface and side surface of conductive trace 256. Composite bump 238 can also be metallurgically connected to conductive trace 256 by bringing fusible portion 242 in physical contact with the conductive trace under reflow temperature. The non-fusible portion 240 does not melt or deform during the application of pressure or temperature and retains its height and shape as a vertical standoff between semiconductor die 224 and substrate 254. The additional displacement between semiconductor die 224 and substrate 254 provides greater coplanarity tolerance between the mating surfaces.

During a reflow process, a large number (e.g., thousands) of composite bumps 238 on semiconductor die 224 are attached to interconnect sites on conductive trace 256 of substrate 254. Some of the bumps 238 may fail to properly connect to conductive trace 256, particularly if die 224 is warped. Recall that composite bump 238 is wider than conductive trace 256. With a proper force applied, the fusible portion 242 deforms or extrudes around the top surface and side surface of conductive trace 256 and mechanically locks composite bump 238 to the conductive trace. The mechanical interlock is formed by nature of the fusible portion 242 being softer and more compliant than conductive trace 256 and therefore deforming over the top surface and around the side surface of the conductive trace for greater contact surface area. The mechanical interlock between composite bump 238 and conductive trace 256 holds the bump to the conductive trace during reflow, i.e., the bump and conductive trace do not lose contact. The oxide layer 257 prevents electrical shorting between adjacent conductive traces 256, as described in FIG. 9. Accordingly, composite bump 238 mating to conductive trace 256 reduces bump interconnect failures.

Figure 12E:
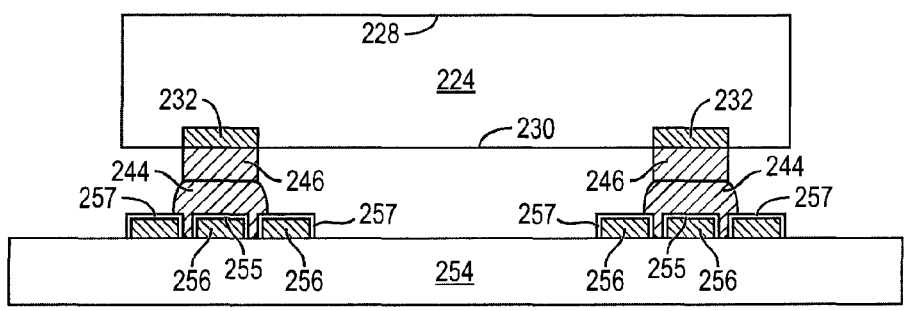

FIG. 12e shows conductive pillar 246 and bump 244 formed over contact pad 232 of semiconductor die 224. Semiconductor die 224 is positioned so that bump 244 is aligned with an interconnect site on conductive trace 256. Alternatively, bump 244 can be aligned with a conductive pad or other interconnect site formed on substrate 254. Bump 244 is wider than conductive trace 256. Conductive traces 256 with interconnect sites are covered by electroless surface treatment 255 and adjacent conductive traces 256 are coated with oxide or insulating layer 257, as described in FIGS. 6a-6d and 8a-8g and similar to FIGS. 7a and 7b.

A pressure or force F is applied to back surface 228 of semiconductor die 224 to press bump 244 onto conductive trace 256. The force F can be applied with an elevated temperature. Due to the compliant nature of bump 244, the bump deforms or extrudes around the top surface and side surface of conductive trace 256. In particular, the application of pressure causes bump 244 to undergo a plastic deformation and cover the top surface and side surface of conductive trace 256. Conductive pillar 246 and bump 244 can also be metallurgically connected to conductive trace 256 by bringing the bump in physical contact with the conductive trace under reflow temperature. Conductive pillar 246 does not melt or deform during the application of pressure or temperature and retains its height and shape as a vertical standoff between semiconductor die 224 and substrate 254. The additional displacement between semiconductor die 224 and substrate 254 provides greater coplanarity tolerance between the mating surfaces. The wider bump 244 and narrower conductive trace 256 have similar low requisite compressive force and mechanical locking features and advantages described above for bump material 234 and bump 236. The oxide layer 257 prevents electrical shorting between adjacent conductive traces 256, as described in FIG. 9.

Figure 12F:
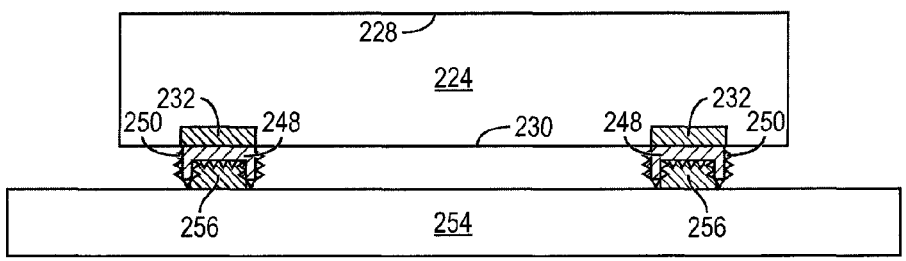

FIG. 12f shows bump material 248 with asperities 250 formed over contact pad 232 of semiconductor die 224. Semiconductor die 224 is positioned so that bump material 248 is aligned with an interconnect site on conductive trace 256. Alternatively, bump material 248 can be aligned with a conductive pad or other interconnect site formed on substrate 254. Bump material 248 is wider than conductive trace 256. A pressure or force F is applied to back surface 228 of semiconductor die 224 to press bump material 248 onto conductive trace 256. The force F can be applied with an elevated temperature. Due to the compliant nature of bump material 248, the bump deforms or extrudes around the top surface and side surface of conductive trace 256. In particular, the application of pressure causes bump material 248 to undergo a plastic deformation and cover the top surface and side surface of conductive trace 256. In addition, asperities 250 are metallurgically connected to conductive trace 256. Asperities 250 are sized on the order about 1-25 μm.

Figure 12G:
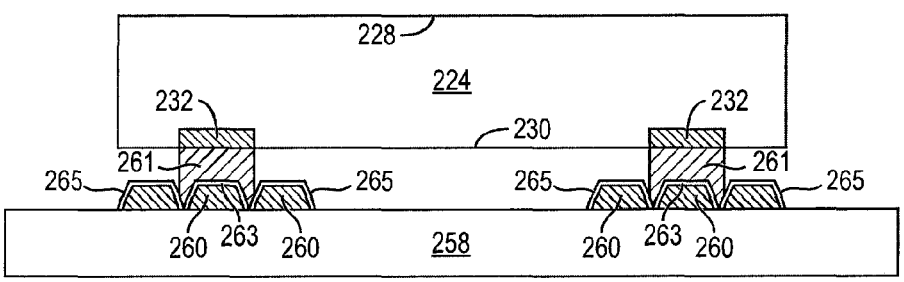

FIG. 12g shows a substrate or PCB 258 with trapezoidal conductive trace 260 having angled or sloped sides. Bump material 261 is formed over contact pad 232 of semiconductor die 224. Semiconductor die 224 is positioned so that bump material 261 is aligned with an interconnect site on conductive trace 260. Alternatively, bump material 261 can be aligned with a conductive pad or other interconnect site formed on substrate 258. Bump material 261 is wider than conductive trace 260. Conductive traces 260 with interconnect sites are covered by electroless surface treatment 263 and adjacent conductive traces 260 are coated with oxide or insulating layer 265, as described in FIGS. 6a-6d and 8a-8g and similar to FIGS. 7a and 7b.

A pressure or force F is applied to back surface 228 of semiconductor die 224 to press bump material 261 onto conductive trace 260. The force F can be applied with an elevated temperature. Due to the compliant nature of bump material 261, the bump material deforms or extrudes around the top surface and side surface of conductive trace 260. In particular, the application of pressure causes bump material 261 to undergo a plastic deformation under force F to cover the top surface and the angled side surface of conductive trace 260. Bump material 261 can also be metallurgically connected to conductive trace 260 by bringing the bump material in physical contact with the conductive trace and then reflowing the bump material under a reflow temperature. The oxide layer 265 prevents electrical shorting between adjacent conductive traces 260, as described in FIG. 9.

FIGS. 13a-13d show a BOL embodiment of semiconductor die 224 and elongated composite bump 262 having a non-fusible or non-collapsible portion 264 and fusible or collapsible portion 266. The non-fusible portion 264 can be Au, Cu, Ni, high-lead solder, or lead-tin alloy. The fusible portion 266 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. The non-fusible portion 264 makes up a larger part of composite bump 262 than the fusible portion 266. The non-fusible portion 264 is fixed to contact pad 232 of semiconductor die 224.

Figure 13A:
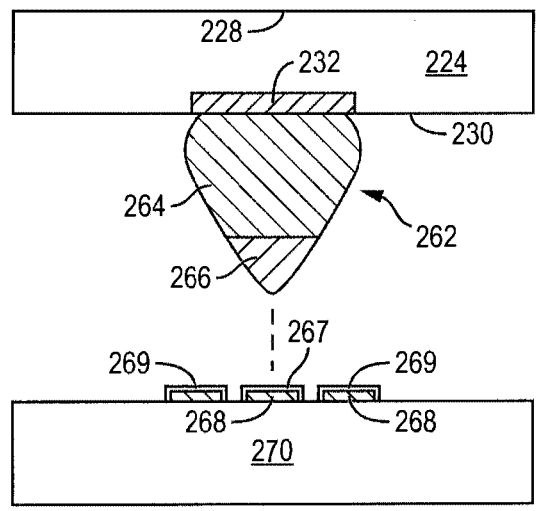
FIGS. 13a-13d illustrate the semiconductor die with a wedge-shaped interconnect structure bonded to the conductive traces.
Figure 13B:
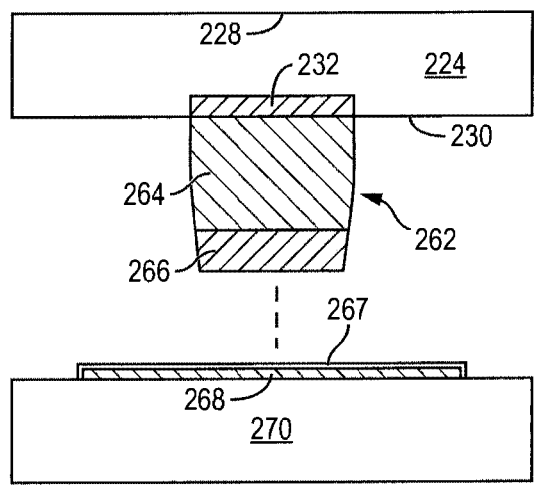
Figure 13C:
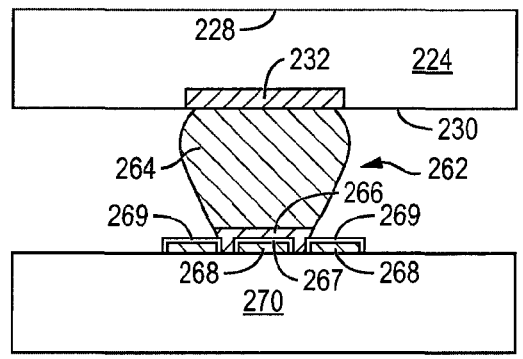
Figure 13D:
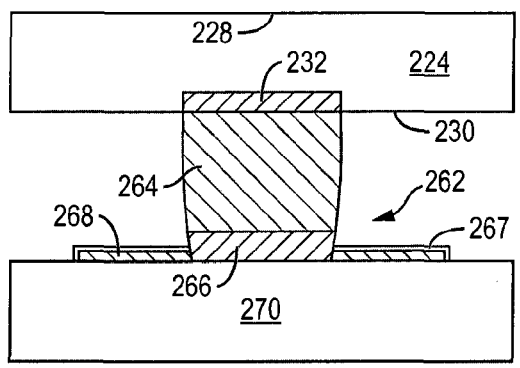

Semiconductor die 224 is positioned so that composite bump 262 is aligned with an interconnect site on conductive trace 268 formed on substrate 270, as shown in FIG. 13a. Composite bump 262 is tapered along conductive trace 268, i.e., the composite bump has a wedge shape, longer along a length of conductive trace 268 and narrower across the conductive trace. The tapered aspect of composite bump 262 occurs along the length of conductive trace 268. The view in FIG. 13a shows the shorter aspect or narrowing taper co-linear with conductive trace 268. The view in FIG. 13b, normal to FIG. 13a, shows the longer aspect of the wedge-shaped composite bump 262. The shorter aspect of composite bump 262 is wider than conductive trace 268. The fusible portion 266 collapses around conductive trace 268 upon application of pressure and/or reflow with heat, as shown in FIGS. 13c and 13d. The non-fusible portion 264 does not melt or deform during reflow and retains its form and shape. The non-fusible portion 264 can be dimensioned to provide a standoff distance between semiconductor die 224 and substrate 270. A finish such as Cu OSP can be applied to substrate 270. Conductive traces 268 with interconnect sites are covered by electroless surface treatment 267 and adjacent conductive traces 268 are coated with oxide or insulating layer 269, as described in FIGS. 6a-6d and 8a-8g and similar to FIGS. 7a and 7b.

During a reflow process, a large number (e.g., thousands) of composite bumps 262 on semiconductor die 224 are attached to interconnect sites on conductive trace 268 of substrate 270. Some of the bumps 262 may fail to properly connect to conductive trace 268, particularly if semiconductor die 224 is warped. Recall that composite bump 262 is wider than conductive trace 268. With a proper force applied, the fusible portion 266 deforms or extrudes around the top surface and side surface of conductive trace 268 and mechanically locks composite bump 262 to the conductive trace. The mechanical interlock is formed by nature of the fusible portion 266 being softer and more compliant than conductive trace 268 and therefore deforming around the top surface and side surface of the conductive trace for greater contact area. The wedge-shape of composite bump 262 increases contact area between the bump and conductive trace, e.g., along the longer aspect of FIGS. 13b and 13d, without sacrificing pitch along the shorter aspect of FIGS. 13a and 13c. The mechanical interlock between composite bump 262 and conductive trace 268 holds the bump to the conductive trace during reflow, i.e., the bump and conductive trace do not lose contact. The oxide layer 269 prevents electrical shorting between adjacent conductive traces 268, as described in FIG. 9. Accordingly, composite bump 262 mating to conductive trace 268 reduces bump interconnect failures.

Figure 14A:
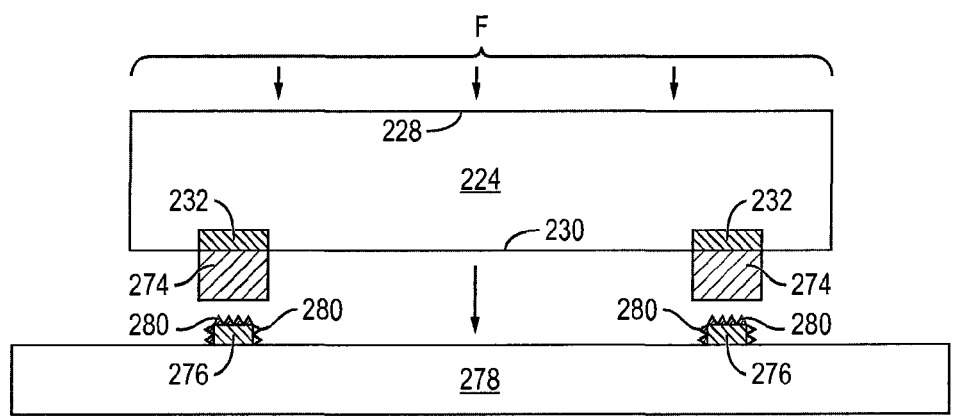
FIGS. 14a-14d illustrate another embodiment of the semiconductor die and interconnect structure bonded to the conductive traces.

FIGS. 14a-14d show a BOL embodiment of semiconductor die 224 with bump material 274 formed over contact pads 232, similar to FIG. 11c. In FIG. 14a, bump material 274 is generally compliant and undergoes plastic deformation greater than about 25 μm under a force equivalent to a vertical load of about 200 grams. Bump material 274 is wider than conductive trace 276 on substrate 278. A plurality of asperities 280 is formed on conductive trace 276 with a height on the order about 1-25 μm.

Figure 14B:
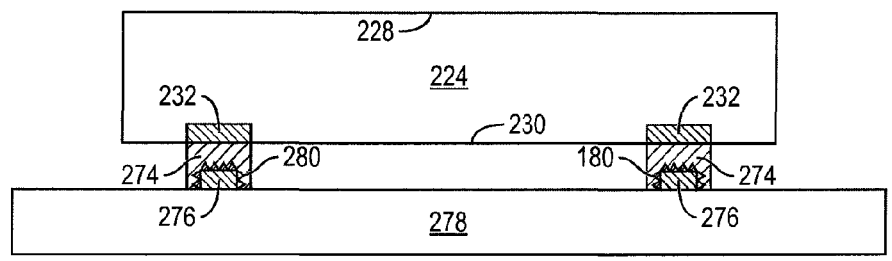

Semiconductor die 224 is positioned so that bump material 274 is aligned with an interconnect site on conductive trace 276. Alternatively, bump material 274 can be aligned with a conductive pad or other interconnect site formed on substrate 278. A pressure or force F is applied to back surface 228 of semiconductor die 224 to press bump material 274 onto conductive trace 276 and asperities 280, as shown in FIG. 14b. The force F can be applied with an elevated temperature. Due to the compliant nature of bump material 274, the bump material deforms or extrudes around the top surface and side surface of conductive trace 276 and asperities 280. In particular, the application of pressure causes bump material 274 to undergo a plastic deformation and cover the top surface and side surface of conductive trace 276 and asperities 280. The plastic flow of bump material 274 creates macroscopic mechanical interlocking points between the bump material and the top surface and side surface of conductive trace 276 and asperities 280. The plastic flow of bump material 274 occurs around the top surface and side surface of conductive trace 276 and asperities 280, but does not extend excessively onto substrate 278, which could cause electrical shorting and other defects. The mechanical interlock between the bump material and the top surface and side surface of conductive trace 276 and asperities 280 provides a robust connection with greater contact area between the respective surfaces, without significantly increasing the bonding force. The mechanical interlock between the bump material and the top surface and side surface of conductive trace 276 and asperities 280 also reduces lateral die shifting during subsequent manufacturing processes, such as encapsulation.

Figure 14C:
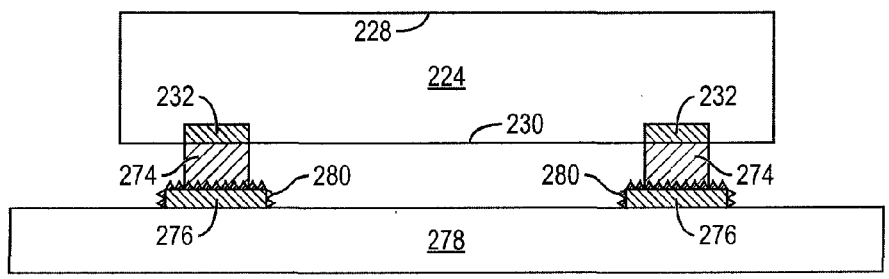

FIG. 14c shows another BOL embodiment with bump material 274 narrower than conductive trace 276. A pressure or force F is applied to back surface 228 of semiconductor die 224 to press bump material 274 onto conductive trace 276 and asperities 280. The force F can be applied with an elevated temperature. Due to the compliant nature of bump material 274, the bump material deforms or extrudes over the top surface of conductive trace 276 and asperities 280. In particular, the application of pressure causes bump material 274 to undergo a plastic deformation and cover the top surface of conductive trace 276 and asperities 280. The plastic flow of bump material 274 creates macroscopic mechanical interlocking points between the bump material and the top surface of conductive trace 276 and asperities 280. The mechanical interlock between the bump material and the top surface of conductive trace 276 and asperities 280 provides a robust connection with greater contact area between the respective surfaces, without significantly increasing the bonding force. The mechanical interlock between the bump material and the top surface of conductive trace 276 and asperities 280 also reduces lateral die shifting during subsequent manufacturing processes, such as encapsulation.

Figure 14D:
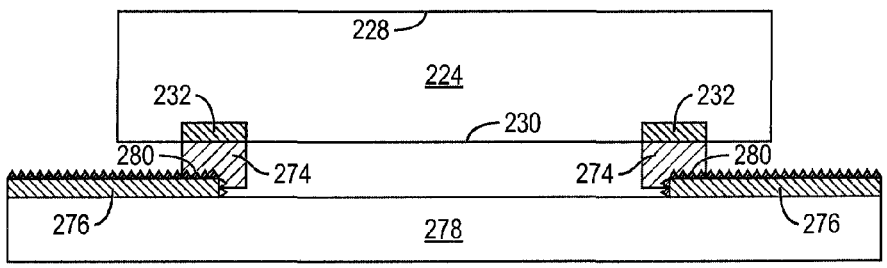

FIG. 14d shows another BOL embodiment with bump material 274 formed over an edge of conductive trace 276, i.e., part of the bump material is over the conductive trace and part of the bump material is not over the conductive trace. A pressure or force F is applied to back surface 228 of semiconductor die 224 to press bump material 274 onto conductive trace 276 and asperities 280. The force F can be applied with an elevated temperature. Due to the compliant nature of bump material 274, the bump material deforms or extrudes over the top surface and side surface of conductive trace 276 and asperities 280. In particular, the application of pressure causes bump material 274 to undergo a plastic deformation and cover the top surface and side surface of conductive trace 276 and asperities 280. The plastic flow of bump material 274 creates macroscopic mechanical interlocking between the bump material and the top surface and side surface of conductive trace 276 and asperities 280. The mechanical interlock between the bump material and the top surface and side surface of conductive trace 276 and asperities 280 provides a robust connection with greater contact area between the respective surfaces, without significantly increasing the bonding force. The mechanical interlock between the bump material and the top surface and side surface of conductive trace 276 and asperities 280 also reduces lateral die shifting during subsequent manufacturing processes, such as encapsulation.

Figure 15A:
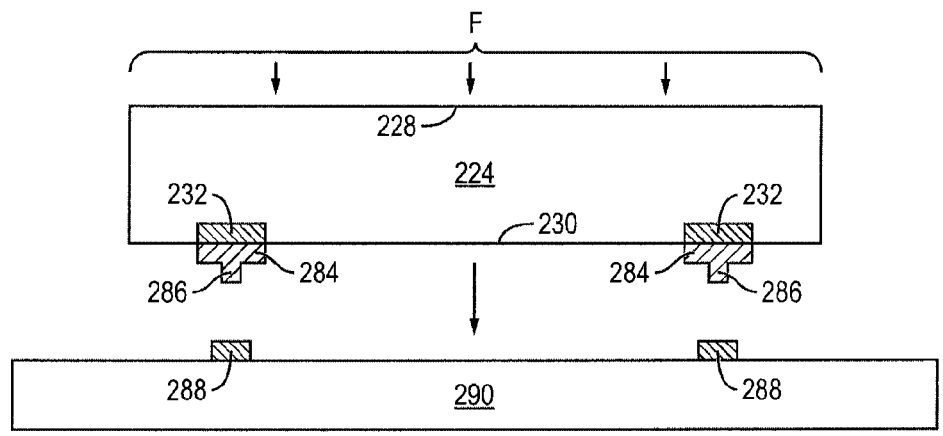
FIGS. 15a-15c illustrate stepped bump and stud bump interconnect structures bonded to the conductive traces.
Figure 15B:
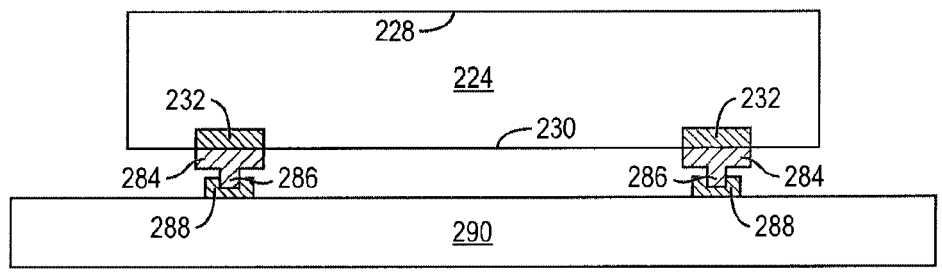
Figure 15C:
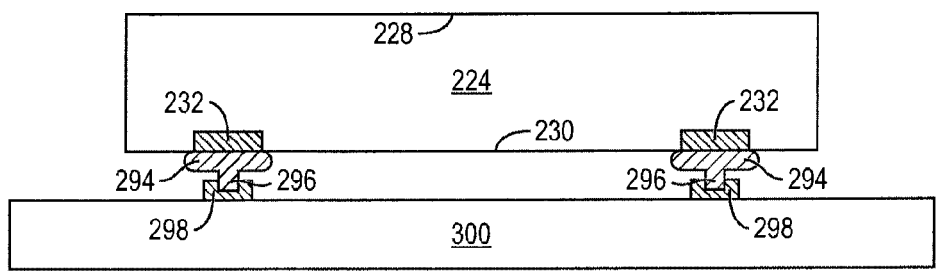

FIGS. 15a-15c show a BOL embodiment of semiconductor die 224 with bump material 284 formed over contact pads 232, similar to FIG. 11c. A tip 286 extends from the body of bump material 284 as a stepped bump with tip 286 narrower than the body of bump material 284, as shown in FIG. 15a. Semiconductor die 224 is positioned so that bump material 284 is aligned with an interconnect site on conductive trace 288 on substrate 290. More specifically, tip 286 is centered over an interconnect site on conductive trace 288. Alternatively, bump material 284 and tip 286 can be aligned with a conductive pad or other interconnect site formed on substrate 290. Bump material 284 is wider than conductive trace 288 on substrate 290.

Conductive trace 288 is generally compliant and undergoes plastic deformation greater than about 25 µm under a force equivalent to a vertical load of about 200 grams. A pressure or force F is applied to back surface 228 of semiconductor die 224 to press tip 284 onto conductive trace 288. The force F can be applied with an elevated temperature. Due to the compliant nature of conductive trace 288, the conductive trace deforms around tip 286, as shown in FIG. 15b. In particular, the application of pressure causes conductive trace 288 to undergo a plastic deformation and cover the top surface and side surface of tip 286.

FIG. 15c shows another BOL embodiment with rounded bump material 294 formed over contact pads 232. A tip 296 extends from the body of bump material 294 to form a stud bump with the tip narrower than the body of bump material 294. Semiconductor die 224 is positioned so that bump material 294 is aligned with an interconnect site on conductive trace 298 on substrate 300. More specifically, tip 296 is centered over an interconnect site on conductive trace 298. Alternatively, bump material 294 and tip 296 can be aligned with a conductive pad or other interconnect site formed on substrate 300. Bump material 294 is wider than conductive trace 298 on substrate 300.

Conductive trace 298 is generally compliant and undergoes plastic deformation greater than about 25 µm under a force equivalent to a vertical load of about 200 grams. A pressure or force F is applied to back surface 228 of semiconductor die 224 to press tip 296 onto conductive trace 298. The force F can be applied with an elevated temperature. Due to the compliant nature of conductive trace 298, the conductive trace deforms around tip 296. In particular, the application of pressure causes conductive trace 298 to undergo a plastic deformation and cover the top surface and side surface of tip 296.

The conductive traces described in FIGS. 12a-12g, 13a-13d, and 14a-14d can also be compliant material as described in FIGS. 15a-15c.

Figure 16A:
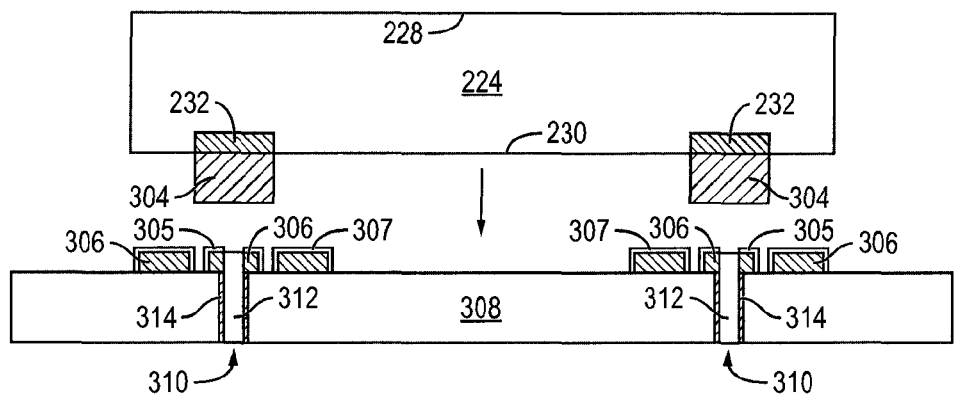
FIGS. 16a-16b illustrate conductive traces with conductive vias.
Figure 16B:
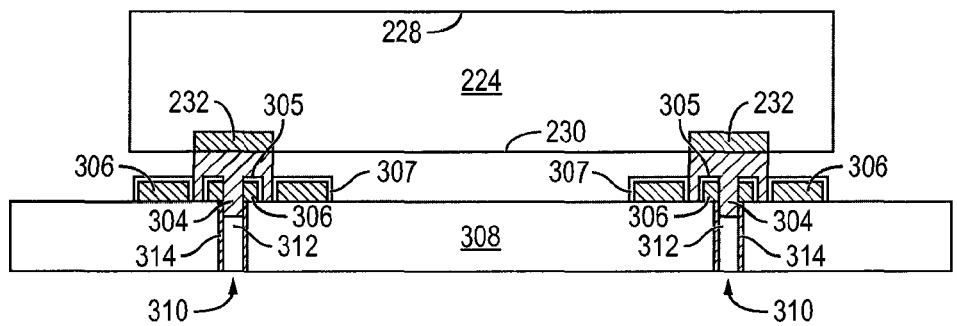

FIGS. 16a-16b show a BOL embodiment of semiconductor die 224 with bump material 304 formed over contact pads 232, similar to FIG. 11c. Bump material 304 is generally compliant and undergoes plastic deformation greater than about 25 µm under a force equivalent to a vertical load of about 200 grams. Bump material 304 is wider than conductive trace 306 on substrate 308. A conductive via 310 is formed through conductive trace 306 with an opening 312 and conductive sidewalls 314, as shown in FIG. 16a. Conductive traces 306 with interconnect sites are covered by electroless surface treatment 305 and adjacent conductive traces 306 are coated with oxide or insulating layer 307, as described in FIGS. 6a-6d and 8a-8g and similar to FIGS. 7a and 7b.

Figure 20A:
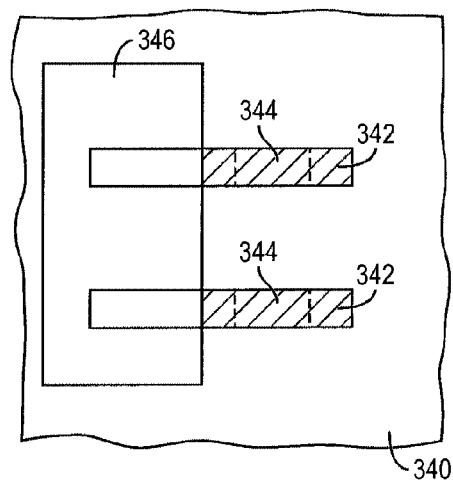
FIGS. 20a-20g illustrate various arrangements of the conductive traces with open solder registration.
Figure 20B:
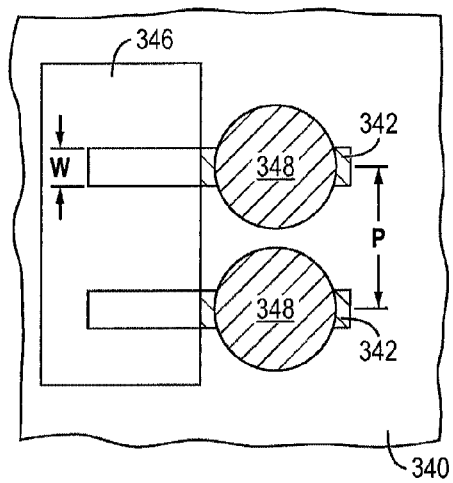
Figure 20C:
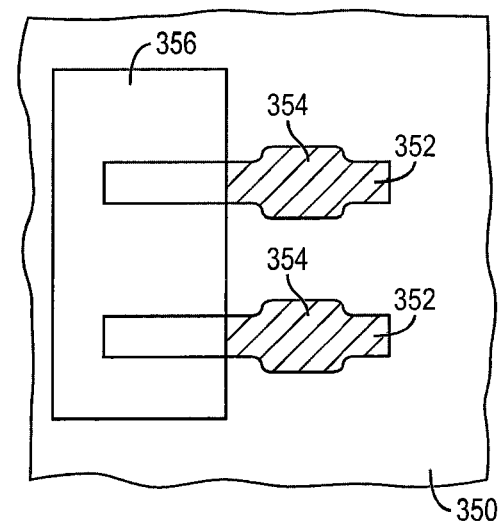
Figure 20D:
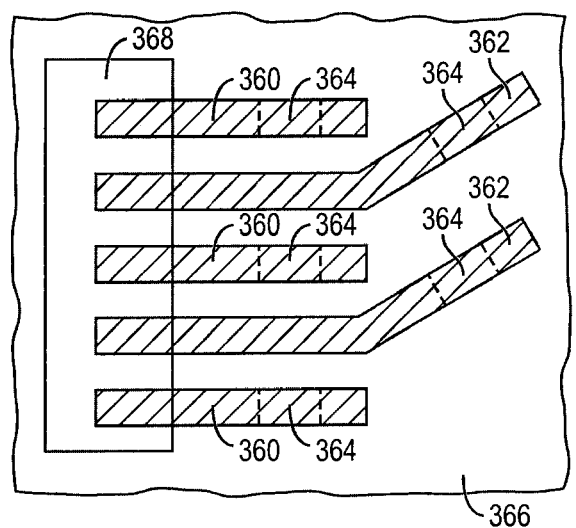
Figure 20E:
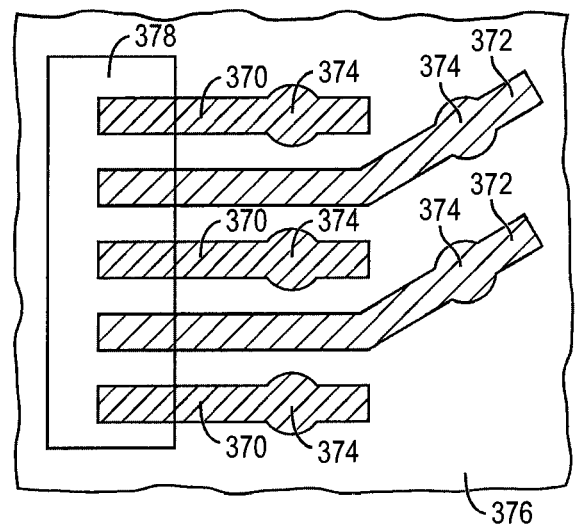
Figure 20F:
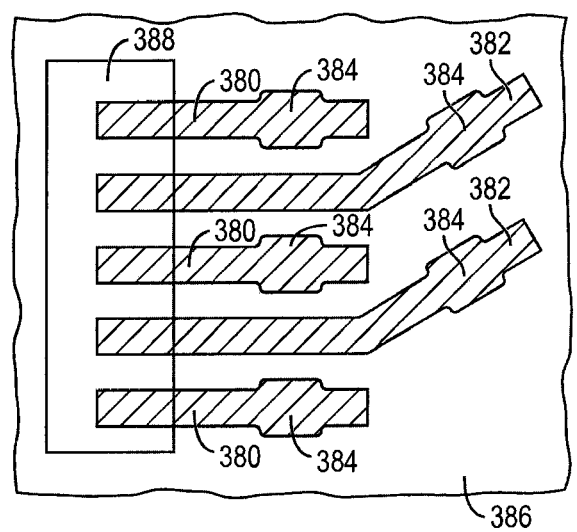
Figure 20G:
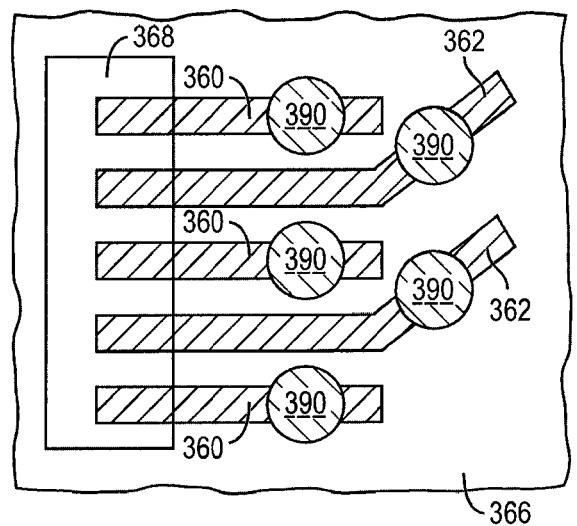

Semiconductor die 224 is positioned so that bump material 304 is aligned with an interconnect site on conductive trace 306, see FIGS. 20-20g. Alternatively, bump material 304 can be aligned with a conductive pad or other interconnect site formed on substrate 308. A pressure or force F is applied to back surface 228 of semiconductor die 224 to press bump material 304 onto conductive trace 306 and into opening 312 of conductive via 310. The force F can be applied with an elevated temperature. Due to the compliant nature of bump material 304, the bump material deforms or extrudes around the top surface and side surface of conductive trace 306 and into opening 312 of conductive vias 310, as shown in FIG. 16b. In particular, the application of pressure causes bump material 304 to undergo a plastic deformation and cover the top surface and side surface of conductive trace 306 and into opening 312 of conductive via 310. The oxide layer 307 prevents electrical shorting between adjacent conductive traces 306, as described in FIG. 9. Bump material 304 is thus electrically connected to conductive trace 306 and conductive sidewalls 314 for z-direction vertical interconnect through substrate 308. The plastic flow of bump material 304 creates a mechanical interlock between the bump material and the top surface and side surface of conductive trace 306 and opening 312 of conductive via 310. The mechanical interlock between the bump material and the top surface and side surface of conductive trace 306 and opening 312 of conductive via 310 provides a robust connection with greater contact area between the respective surfaces, without significantly increasing the bonding force. The mechanical interlock between the bump material and the top surface and side surface of conductive trace 306 and opening 312 of conductive via 310 also reduces lateral die shifting during subsequent manufacturing processes, such as encapsulation. Since conductive via 310 is formed within the interconnect site with bump material 304, the total substrate interconnect area is reduced.

In the BOL embodiments of FIGS. 12a-12g, 13a-13d, 14a-14d, 15a-15c, and 16a-16b, by making the conductive trace narrower than the interconnect structure, the conductive trace pitch can be reduced to increase routing density and I/O count. The narrower conductive trace reduces the force F needed to deform the interconnect structure around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming the interconnect structure around the conductive trace mechanically locks the bump to the trace to prevent die shifting or die floating during reflow.

Figure 17A:
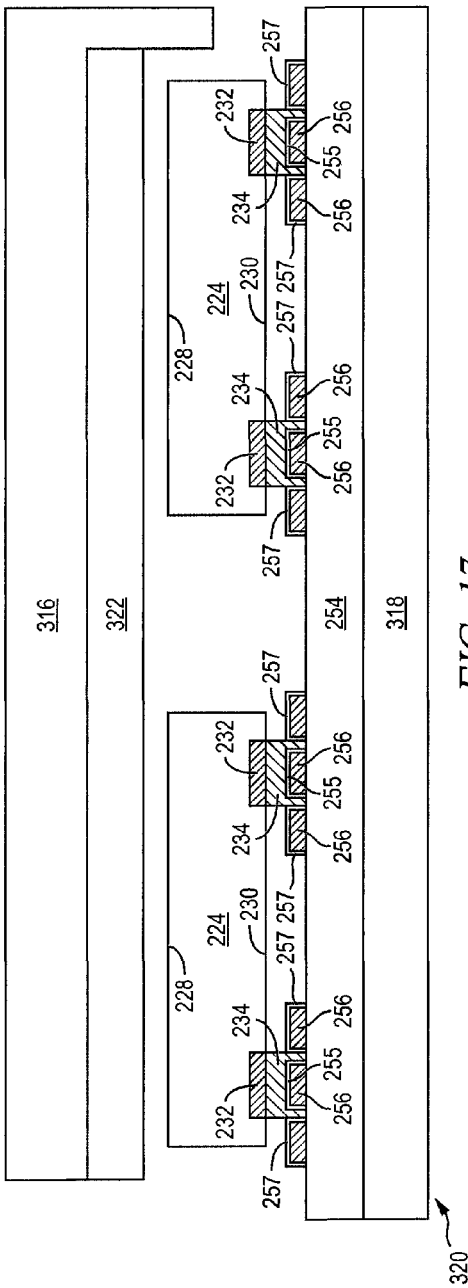
Figure 17B:
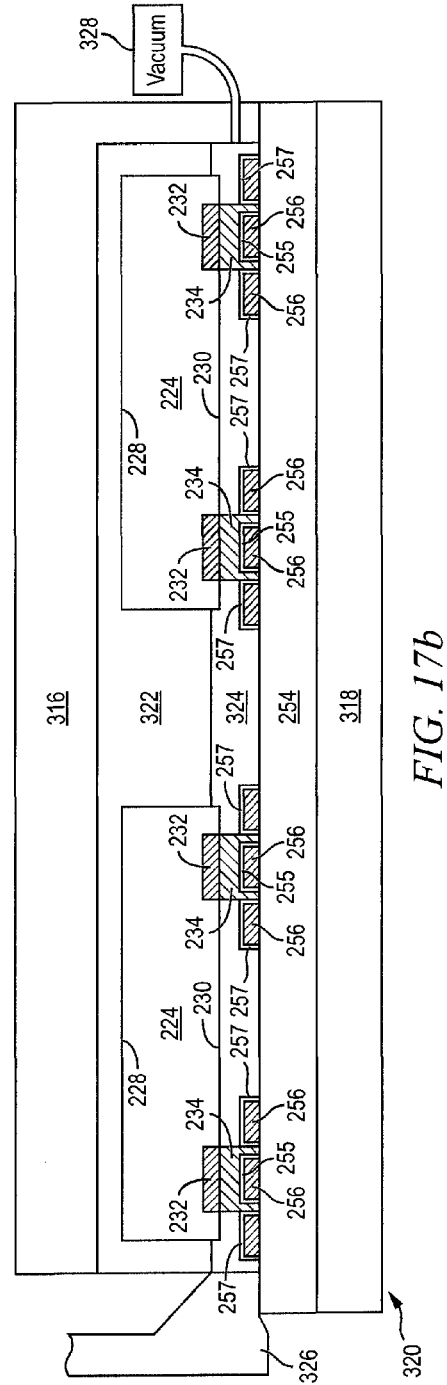

FIGS. 17a-17c show a mold underfill (MUF) process to deposit encapsulant around the bumps between the semiconductor die and substrate. FIG. 17a shows semiconductor die 224 mounted to substrate 254 using bump material 234 from FIG. 12b and placed between upper mold support 316 and lower mold support 318 of chase mold 320. The other semiconductor die and substrate combinations from FIGS. 12a-12g, 13a-13d, 14a-14d, 15a-15c, and 16a-16b can be placed between upper mold support 316 and lower mold support 318 of chase mold 320. The upper mold support 316 includes compressible releasing film 322.

In FIG. 17b, upper mold support 316 and lower mold support 318 are brought together to enclose semiconductor die 224 and substrate 254 with an open space over the substrate and between the semiconductor die and substrate. Compressible releasing film 322 conforms to back surface 228 and side surface of semiconductor die 224 to block formation of encapsulant on these surfaces. An encapsulant 324 in a liquid state is injected into one side of chase mold 320 with nozzle 326 while an optional vacuum assist 328 draws pressure from the opposite side to uniformly fill the open space over substrate 254 and the open space between semiconductor die 224 and substrate 254 with the encapsulant. Encapsulant 324 can be polymer composite material, such as epoxy resin with filler, epoxy acrylate with filler, or polymer with proper filler. Encapsulant 324 is non-conductive and environmentally protects the semiconductor device from external elements and contaminants. Compressible material 322 prevents encapsulant 324 from flowing over back surface 228 and around the side surface of semiconductor die 224. Encapsulant 324 is cured. The back surface 228 and side surface of semiconductor die 224 remain exposed from encapsulant 324.

FIG. 17c shows an embodiment of MUF and mold overfill (MOF), i.e., without compressible material 322. Semiconductor die 224 and substrate 254 are placed between upper mold support 316 and lower mold support 318 of chase mold 320. The upper mold support 316 and lower mold support 318 are brought together to enclose semiconductor die 224 and substrate 254 with an open space over the substrate, around the semiconductor die, and between the semiconductor die and substrate. Encapsulant 324 in a liquid state is injected into one side of chase mold 320 with nozzle 326 while an optional vacuum assist 328 draws pressure from the opposite side to uniformly fill the open space around semiconductor die 224 and over substrate 254 and the open space between semiconductor die 224 and substrate 254 with the encapsulant. Encapsulant 324 is cured.

FIG. 18 shows another embodiment of depositing encapsulant around semiconductor die 224 and in the gap between semiconductor die 224 and substrate 254. Semiconductor die 224 and substrate 254 are enclosed by dam 330. Encapsulant 332 is dispensed from nozzles 334 in a liquid state into dam 330 to fill the open space over substrate 254 and the open space between semiconductor die 224 and substrate 254. The volume of encapsulant 332 dispensed from nozzles 334 is controlled to fill dam 330 without covering back surface 228 or the side surface of semiconductor die 224. Encapsulant 332 is cured.

Figure 19:
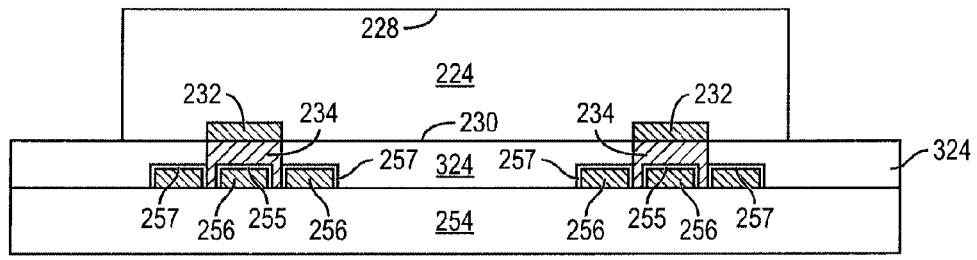
FIG. 19 illustrates the semiconductor die and substrate after mold underfill.

FIG. 19 shows semiconductor die 224 and substrate 254 after the MUF process from FIGS. 17a, 17c, and 18. Encapsulant 324 is uniformly distributed over substrate 254 and around bump material 234 between semiconductor die 224 and substrate 254.

FIGS. 20a-20g show top views of various conductive trace layouts on substrate or PCB 340. In FIG. 20a, conductive trace 342 is a straight conductor with integrated bump pad or interconnect site 344 formed on substrate 340. The sides of substrate bump pad 344 can be co-linear with conductive trace 342. In the prior art, a solder registration opening (SRO) is typically formed over the interconnect site to contain the bump material during reflow. The SRO increases interconnect pitch and reduces I/O count. In contrast, masking layer 346 can be formed over a portion of substrate 340; however, the masking layer is not formed around substrate bump pad 344 of conductive trace 342. That is, the portion of conductive trace 342 designed to mate with the bump material is devoid of any SRO of masking layer 346 that would have been used for bump containment during reflow.

Semiconductor die 224 is placed over substrate 340 and the bump material is aligned with substrate bump pads 344. The bump material is electrically and metallurgically connected to substrate bump pads 344 by bringing the bump material in physical contact with the bump pad and then reflowing the bump material under a reflow temperature.

In another embodiment, an electrically conductive bump material is deposited over substrate bump pad 344 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 344 using a suitable attachment or bonding process. In one embodiment, the bump material is reflowed by heating the material above its melting point to form bump or interconnect 348, as shown in FIG. 20b. In some applications, bump 348 is reflowed a second time to improve electrical contact to substrate bump pad 344. The bump material around the narrow substrate bump pad 344 maintains die placement during reflow.

In high routing density applications, it is desirable to minimize escape pitch of conductive traces 342. The escape pitch between conductive traces 342 can be reduced by eliminating the masking layer for the purpose of reflow containment, i.e., by reflowing the bump material without a masking layer. Since no SRO is formed around die bump pad 232 or substrate bump pad 344, conductive traces 342 can be formed with a finer pitch, i.e., conductive trace 342 can be disposed closer together or to nearby structures. With no SRO around substrate bump pad 344, the pitch between conductive traces 342 is given as P=D+PLT+W/2, wherein D is the base diameter of bump 348, PLT is die placement tolerance, and W is the width of conductive trace 342. In one embodiment, given a bump base diameter of 100 μm, PLT of 10 μm, and trace line width of 30 μm, the minimum escape pitch of conductive trace 342 is 125 μm. The mask-less bump formation eliminates the need to account for the ligament spacing of masking material between adjacent openings, solder mask registration tolerance (SRT), and minimum resolvable SRO, as found in the prior art.

When the bump material is reflowed without a masking layer to metallurgically and electrically connect die bump pad 232 to substrate bump pad 344, the wetting and surface tension causes the bump material to maintain self-confinement and be retained within the space between die bump pad 232 and substrate bump pad 344 and portion of substrate 340 immediately adjacent to conductive trace 342 substantially within the footprint of the bump pads.

To achieve the desired self-confinement property, the bump material can be immersed in a flux solution prior to placement on die bump pad 232 or substrate bump pad 344 to selectively render the region contacted by the bump material more wettable than the surrounding area of conductive traces 342. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 340 is not needed around die bump pad 232 or substrate bump pad 344.

FIG. 20c shows another embodiment of parallel conductive traces 352 as a straight conductor with integrated rectangular bump pad or interconnect site 354 formed on substrate 350. In this case, substrate bump pad 354 is wider than conductive trace 352, but less than the width of the mating bump. The sides of substrate bump pad 354 can be parallel to conductive trace 352. Masking layer 356 can be formed over a portion of substrate 350; however, the masking layer is not formed around substrate bump pad 354 of conductive trace 352. That is, the portion of conductive trace 352 designed to mate with the bump material is devoid of any SRO of masking layer 356 that would have been used for bump containment during reflow.

FIG. 20d shows another embodiment of conductive traces 360 and 362 arranged in an array of multiple rows with offset integrated bump pad or interconnect site 364 formed on substrate 366 for maximum interconnect density and capacity. Alternate conductive traces 360 and 362 include an elbow for routing to bump pads 364. The sides of each substrate bump pad 364 is co-linear with conductive traces 360 and 362. Masking layer 368 can be formed over a portion of substrate 366; however, masking layer 368 is not formed around substrate bump pad 364 of conductive traces 360 and 362. That is, the portion of conductive trace 360 and 362 designed to mate with the bump material is devoid of any SRO of masking layer 368 that would have been used for bump containment during reflow.

FIG. 20e shows another embodiment of conductive traces 370 and 372 arranged in an array of multiple rows with offset integrated bump pad or interconnect site 374 formed on substrate 376 for maximum interconnect density and capacity. Alternate conductive traces 370 and 372 include an elbow for routing to bump pads 374. In this case, substrate bump pad 374 is rounded and wider than conductive traces 370 and 372, but less than the width of the mating interconnect bump material. Masking layer 378 can be formed over a portion of substrate 376; however, masking layer 378 is not formed around substrate bump pad 374 of conductive traces 370 and 372. That is, the portion of conductive trace 370 and 372 designed to mate with the bump material is devoid of any SRO of masking layer 378 that would have been used for bump containment during reflow.

FIG. 20f shows another embodiment of conductive traces 380 and 382 arranged in an array of multiple rows with offset integrated bump pad or interconnect site 384 formed on substrate 386 for maximum interconnect density and capacity. Alternate conductive traces 380 and 382 include an elbow for routing to bump pads 384. In this case, substrate bump pad 384 is rectangular and wider than conductive traces 380 and 382, but less than the width of the mating interconnect bump material. Masking layer 388 can be formed over a portion of substrate 386; however, masking layer 388 is not formed around substrate bump pad 384 of conductive traces 380 and 382. That is, the portion of conductive trace 380 and 382 designed to mate with the bump material is devoid of any SRO of masking layer 388 that would have been used for bump containment during reflow.

As one example of the interconnect process, semiconductor die 224 is placed over substrate 366 and bump material 234 is aligned with substrate bump pads 364 from FIG. 20d. Bump material 234 is electrically and metallurgically connected to substrate bump pad 364 by pressing the bump material or by bringing the bump material in physical contact with the bump pad and then reflowing the bump material under a reflow temperature, as described for FIGS. 12a-12g, 13a-13d, 14a-14d, 15a-15c, and 16a-16b.

In another embodiment, an electrically conductive bump material is deposited over substrate bump pad 364 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 364 using a suitable attachment or bonding process. In one embodiment, the bump material is reflowed by heating the material above its melting point to form bump or interconnect 390, as shown in FIG. 20g. In some applications, bump 390 is reflowed a second time to improve electrical contact to substrate bump pad 364. The bump material around the narrow substrate bump pad 364 maintains die placement during reflow. Bump material 234 or bumps 390 can also be formed on substrate bump pad configurations of FIGS. 20a-20g.

In high routing density applications, it is desirable to minimize escape pitch of conductive traces 360 and 362 or other conductive trace configurations of FIGS. 20a-20g. The escape pitch between conductive traces 360 and 362 can be reduced by eliminating the masking layer for the purpose of reflow containment, i.e., by reflowing the bump material without a masking layer. Since no SRO is formed around die bump pad 232 or substrate bump pad 364, conductive traces 360 and 362 can be formed with a finer pitch, i.e., conductive traces 360 and 362 can be disposed closer together or to nearby structures. With no SRO around substrate bump pad 364, the pitch between conductive traces 360 and 362 is given as $P=D/2+PLT+W/2$, wherein D is the base diameter of bump 390, PLT is die placement tolerance, and W is the width of conductive traces 360 and 362. In one embodiment, given a bump base diameter of 100 µm, PLT of 10 µm, and trace line width of 30 µm, the minimum escape pitch of conductive traces 360 and 362 is 125 µm. The mask-less bump formation eliminates the need to account for the ligament spacing of masking material between adjacent openings, SRT, and minimum resolvable SRO, as found in the prior art.

When the bump material is reflowed without a masking layer to metallurgically and electrically connect die bump pad 232 to substrate bump pad 364, the wetting and surface tension causes the bump material to maintain self-confinement and be retained within the space between die bump pad 232 and substrate bump pad 364 and portion of substrate 366 immediately adjacent to conductive traces 360 and 362 substantially within the footprint of the bump pads.

To achieve the desired self-confinement property, the bump material can be immersed in a flux solution prior to placement on die bump pad 232 or substrate bump pad 364 to selectively render the region contacted by the bump material more wettable than the surrounding area of conductive traces 360 and 362. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 368 is not needed around die bump pad 232 or substrate bump pad 364.

Figure 21A:
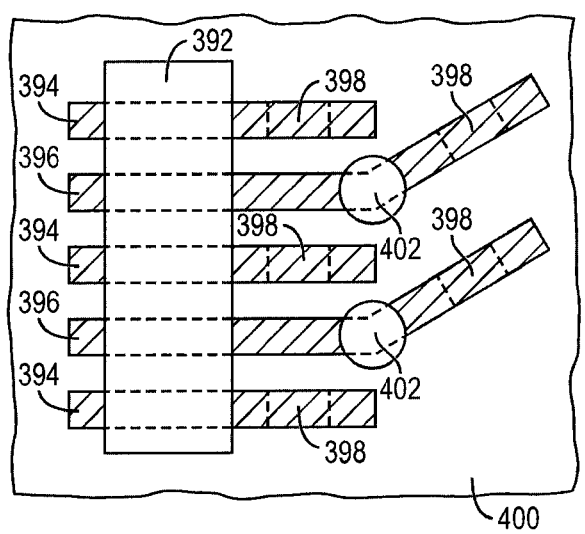
FIGS. 21a-21b illustrate the open solder registration with patches between the conductive traces.
Figure 21B:
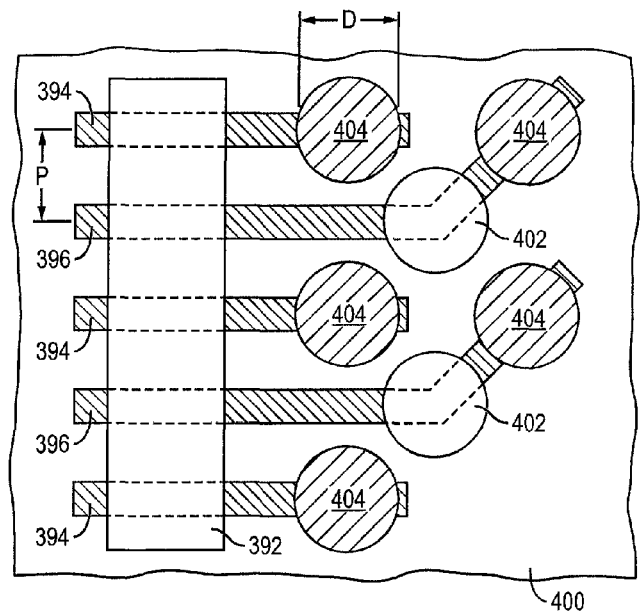

In FIG. 21a, masking layer 392 is deposited over a portion of conductive traces 394 and 396. However, masking layer 392 is not formed over integrated bump pads 398. Consequently, there is no SRO for each bump pad 398 on substrate 400. A non-wettable masking patch 402 is formed on substrate 400 interstitially within the array of integrated bump pads 398, i.e., between adjacent bump pads. The masking patch 402 can also be formed on semiconductor die 224 interstitially within the array of die bump pads 398. More generally, the masking patch is formed in close proximity to the integrated bump pads in any arrangement to prevent run-out to less wettable areas.

Semiconductor die 224 is placed over substrate 400 and the bump material is aligned with substrate bump pads 398. The bump material is electrically and metallurgically connected to substrate bump pad 398 by pressing the bump material or by bringing the bump material in physical contact with the bump pad and then reflowing the bump material under a reflow temperature, as described for FIGS. 12a-12g, 13a-13d, 14a-14d, 15a-15c, and 16a-16b.

In another embodiment, an electrically conductive bump material is deposited over die integrated bump pads 398 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to integrated bump pads 398 using a suitable attachment or bonding process. In one embodiment, the bump material is reflowed by heating the material above its melting point to form spherical balls or bumps 404. In some applications, bumps 404 are reflowed a second time to improve electrical contact to integrated bump pads 398. The bumps can also be compression bonded to integrated bump pads 398. Bumps 404 represent one type of interconnect structure that can be formed over integrated bump pads 398. The interconnect structure can also use stud bump, micro bump, or other electrical interconnect.

In high routing density applications, it is desirable to minimize escape pitch. In order to reduce the pitch between conductive traces 394 and 396, the bump material is reflowed without a masking layer around integrated bump pads 398. The escape pitch between conductive traces 394 and 396 can be reduced by eliminating the masking layer and associated SROs around the integrated bump pads for the purpose of reflow containment, i.e., by reflowing the bump material without a masking layer. Masking layer 392 can be formed over a portion of conductive traces 394 and 396 and substrate 400 away from integrated bump pads 398; however, masking layer 392 is not formed around integrated bump pads 398. That is, the portion of conductive trace 394 and 396 designed to mate with the bump material is devoid of any SRO of masking layer 392 that would have been used for bump containment during reflow.

In addition, masking patch 402 is formed on substrate 400 interstitially within the array of integrated bump pads 398. Masking patch 402 is non-wettable material. Masking patch 402 can be the same material as masking layer 392 and applied during the same processing step, or a different material during a different processing step. Masking patch 402 can be formed by selective oxidation, plating, or other treatment of the portion of the trace or pad within the array of integrated bump pads 398. Masking patch 402 confines bump material flow to integrated bump pads 398 and prevents leaching of conductive bump material to adjacent structures.

When the bump material is reflowed with masking patch 402 interstitially disposed within the array of integrated bump pads 398, the wetting and surface tension causes the bump material to be confined and retained within the space between die bump pads 232 and integrated bump pads 398 and portion of substrate 400 immediately adjacent to conductive traces 394 and 396 and substantially within the footprint of the integrated bump pads 398.

To achieve the desired confinement property, the bump material can be immersed in a flux solution prior to placement on die bump pads 232 or integrated bump pads 398 to selectively render the region contacted by the bump material more wettable than the surrounding area of conductive traces 394 and 396. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 392 is not needed around die bump pads 232 or integrated bump pads 398.

Since no SRO is formed around die bump pads 232 or integrated bump pads 398, conductive traces 394 and 396 can be formed with a finer pitch, i.e., the conductive traces can be disposed closer to adjacent structures without making contact and forming electrical shorts. Assuming the same solder registration design rule, the pitch between conductive traces 394 and 396 is given as $P=(1.1D+W)/2$, where D is the base diameter of bump 404 and W is the width of conductive traces 394 and 396. In one embodiment, given a bump diameter of 100 μm and trace line width of 20 μm, the minimum escape pitch of conductive traces 394 and 396 is 65 μm. The bump formation eliminates the need to account for the ligament spacing of masking material between adjacent openings and minimum resolvable SRO, as found in the prior art.

Figure 22:
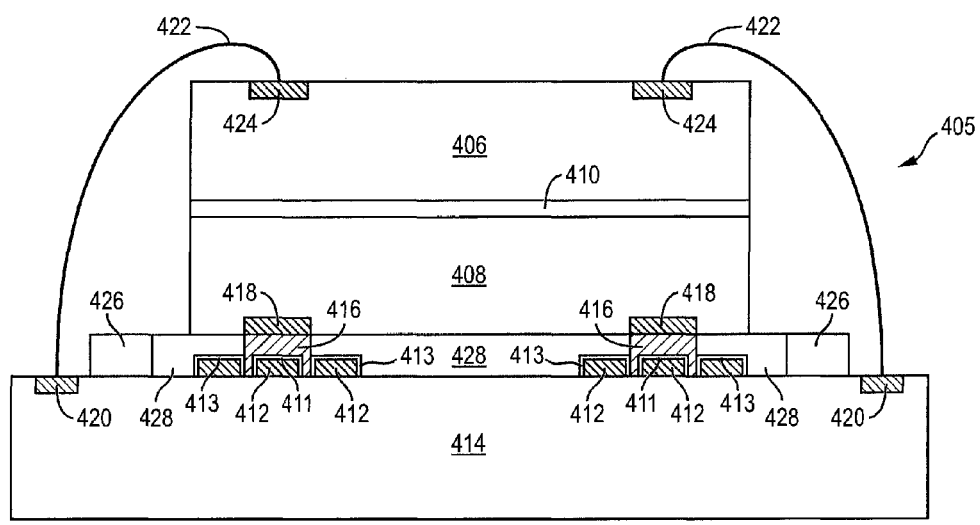
FIG. 22 illustrates a POP with masking layer dam to restrain the encapsulant during mold underfill.

FIG. 22 shows package-on-package (PoP) 405 with semiconductor die 406 stacked over semiconductor die 408 using die attach adhesive 410. Semiconductor die 406 and 408 each have an active surface containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within the active surface to implement analog circuits or digital circuits, such as DSP, ASIC, memory, or other signal processing circuit. Semiconductor die 406 and 408 can also contain IPDs, such as inductors, capacitors, and resistors, for RF signal processing.

Semiconductor die 408 is mounted to conductive traces 412 formed on substrate 414 using bump material 416 formed on contact pads 418, using any of the embodiments from FIGS. 12a-12g, 13a-13d, 14a-14d, 15a-15c, and 16a-16b. Conductive traces 412 with interconnect sites are covered by electroless surface treatment 411 and adjacent conductive traces 412 are coated with oxide or insulating layer 413, as described in FIGS. 6a-6d and 8a-8g and similar to FIGS. 7a and 7b. The oxide layer 413 prevents electrical shorting between adjacent conductive traces 412, as described in FIG. 9. Semiconductor die 406 is electrically connected to contact pads 420 formed on substrate 414 using bond wires 422. The opposite end of bond wire 422 is bonded to contact pads 424 on semiconductor die 406.

Masking layer 426 is formed over substrate 414 and opened beyond the footprint of semiconductor die 408. While masking layer 426 does not confine bump material 416 to conductive traces 412 during reflow, the open mask can operate as a dam to prevent encapsulant 428 from migrating to contact pads 420 or bond wires 422 during MUF. Encapsulant 428 is deposited between semiconductor die 408 and substrate 414, similar to FIGS. 17a-17c. Masking layer 426 blocks MUF encapsulant 428 from reaching contact pads 420 and bond wires 422, which could cause a defect. Masking layer 426 allows a larger semiconductor die to be placed on a given substrate without risk of encapsulant 428 bleeding onto contact pads 420.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
   a substrate;

an interconnect site contacting a surface of the substrate;
a surface treatment formed over a top surface and a side surface of the interconnect site;
a conductive trace formed over the surface of the substrate less than 150 micrometers from the interconnect site and electrically isolated from the interconnect site; and
a copper oxide layer formed over the conductive trace with the interconnect site and surface treatment devoid of the copper oxide layer.

2. The semiconductor device of claim 1, further including a semiconductor die disposed over the substrate with an interconnect structure electrically connecting the semiconductor die to the interconnect site and contacting the copper oxide layer over the conductive trace.

3. The semiconductor device of claim 2, wherein the interconnect structure is selected from a group consisting of a bump including fusible material, bump including non-fusible portion and fusible portion, bump including surface asperities, bump having a length along the interconnect site greater than a width across the interconnect site, and bump including a tip.

4. The semiconductor device of claim 2, further including an underfill material disposed between the semiconductor die and substrate.

5. The semiconductor device of claim 1, further including an opening formed through the interconnect site.

6. The semiconductor device of claim 1, further including a mask patch formed over the conductive trace.

7. A method of making a semiconductor device, comprising:
providing a substrate;
forming an interconnect site contacting a surface of the substrate;
forming a surface treatment over a top surface and a side surface of the interconnect site;
forming a conductive trace over the surface of the substrate and electrically isolated from the interconnect site; and
forming a copper oxide layer over the conductive trace with the interconnect site and surface treatment devoid of the copper oxide layer.

8. The method of claim 7, further including:
forming an interconnect structure over the interconnect site with a portion of the interconnect structure over first and second surfaces of the copper oxide layer; and
disposing a semiconductor die over the substrate with the interconnect structure electrically connecting the semiconductor die to the interconnect site and contacting the copper oxide layer over the conductive trace.

9. The method of claim 8, wherein the interconnect structure is selected from a group consisting of a bump including fusible material, bump including non-fusible portion and fusible portion, bump including surface asperities, bump having a length along the interconnect site greater than a width across the interconnect site, and bump including a tip.

10. The method of claim 8, further including disposing an underfill material between the semiconductor die and substrate.

11. The method of claim 7, further including forming a mask patch over the conductive trace.

12. The method of claim 7, wherein forming the copper oxide layer includes:
forming a mask over the interconnect site including an opening over the conductive trace; and
forming the copper oxide layer over the conductive trace.

13. A semiconductor device, comprising:
a substrate;
an interconnect site contacting a surface of the substrate, the interconnect site including a top surface and a side surface;
a surface treatment formed over the top surface and the side surface of the interconnect site;
a conductive trace formed over the surface of the substrate and electrically isolated from the interconnect site;
a copper oxide layer formed over the conductive trace, wherein the interconnect site and the surface treatment are devoid of the copper oxide layer;
a semiconductor die; and
a bump formed between the semiconductor die and interconnect site and over the top surface and side surface of the surface treatment, the bump contacting the surface of the substrate between the interconnect site and the conductive trace, the bump contacting the copper oxide layer, and the copper oxide layer separating the bump from the conductive trace.

14. The semiconductor device of claim 13, wherein the bump electrically connects the semiconductor die to the interconnect site.

15. The semiconductor device of claim 14, wherein the bump includes a non-fusible portion and fusible portion.

16. The semiconductor device of claim 14, further including an underfill material disposed between the semiconductor die and substrate.

17. A semiconductor device, comprising:
a substrate;
an interconnect site formed over the substrate;
a surface treatment formed over a top surface and a side surface of the interconnect site and contacting the substrate;
a conductive trace formed over the substrate;
a copper oxide layer covering a width of the conductive trace; and
a bump formed between a semiconductor die and the interconnect site, the bump contacting the surface treatment and copper oxide layer.

18. The semiconductor device of claim 17, wherein the conductive trace is formed over the substrate within a footprint of the bump.

19. The semiconductor device of claim 17, wherein the conductive trace is formed over the substrate less than 150 micrometers from the interconnect site.

20. The semiconductor device of claim 17, wherein the conductive trace is formed over the substrate adjacent to the interconnect site.

21. A semiconductor device, comprising:
a substrate;
an interconnect site contacting a surface of the substrate;
a surface treatment formed over a top surface and a side surface of the interconnect site;
a conductive layer formed over the surface of the substrate and electrically isolated from the interconnect site; and
a copper oxide layer formed over the conductive layer with the interconnect site and surface treatment devoid of the copper oxide layer.

22. The semiconductor device of claim 21, wherein the copper oxide layer includes an oxide layer.

23. The semiconductor device of claim 21, wherein the interconnect site includes a contact pad.

24. The semiconductor device of claim 21, further including a bump disposed over the interconnect site.

25. The semiconductor device of claim 21, wherein the conductive layer is electrically isolated from the interconnect site by the copper oxide layer.

26. The semiconductor device of claim 21, further including a mask formed over the interconnect site with an opening in the mask over the conductive layer.

27. The semiconductor device of claim 13, wherein the conductive trace is disposed within a footprint of the bump.

* * * * *